(12) United States Patent
Dede

(10) Patent No.: US 8,391,008 B2
(45) Date of Patent: Mar. 5, 2013

(54) POWER ELECTRONICS MODULES AND POWER ELECTRONICS MODULE ASSEMBLIES

(75) Inventor: Ercan Mehmet Dede, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 210 days.

(21) Appl. No.: 13/029,216

(22) Filed: Feb. 17, 2011

(65) Prior Publication Data

US 2012/0212907 A1    Aug. 23, 2012

(51) Int. Cl.
*H05K 7/20* (2006.01)

(52) U.S. Cl. .............. 361/702; 361/679.46; 361/679.53; 361/689; 361/699; 361/700; 361/715; 165/80.4; 165/104.21; 165/104.33; 165/185; 257/713; 257/714; 257/723; 257/724; 257/E23.098; 62/3.3; 62/259.2

(58) Field of Classification Search ............. 361/679.46, 361/679.53, 688, 689, 699–714, 715–724; 257/686, 698, 700–727, 676, 790, 668, 679, 257/796; 174/16.3, 252, 15.1; 165/80.2–80.5, 165/104.21, 104.33, 104.34, 185; 62/3.2, 62/3.3, 259.2, 3.7, 113, 114, 117, 61, 79; 29/890.03
See application file for complete search history.

(56) References Cited

U.S. PATENT DOCUMENTS

| | | | |
|---|---|---|---|
| 4,322,737 A | 3/1982 | Sliwa, Jr. | |
| 4,392,153 A | 7/1983 | Glascock, II et al. | |
| 4,420,739 A * | 12/1983 | Herren | 338/53 |
| 4,494,171 A | 1/1985 | Bland et al. | |
| 4,733,293 A | 3/1988 | Gabuzda | |
| 4,748,495 A | 5/1988 | Kucharek | |
| 4,783,721 A | 11/1988 | Yamamoto et al. | |
| 4,868,712 A | 9/1989 | Woodman | |
| 4,920,574 A | 4/1990 | Yamamoto et al. | |
| 4,956,746 A * | 9/1990 | Gates et al. | 361/699 |
| 5,016,138 A | 5/1991 | Woodman | |
| 5,023,695 A | 6/1991 | Umezawa et al. | |
| 5,079,619 A | 1/1992 | Davidson | |
| 5,088,005 A | 2/1992 | Ciaccio | |
| 5,119,175 A | 6/1992 | Long et al. | |
| 5,145,001 A | 9/1992 | Valenzuela | |

(Continued)

OTHER PUBLICATIONS

U.S. Appl. No. 12/880,386, filed Sep. 13, 2010, titled: Jet Impingement Heat Exchanger Apparatuses and Power Electronics Modules.

(Continued)

*Primary Examiner* — Michail V Datskovskiy
(74) *Attorney, Agent, or Firm* — Dinsmore & Shohl LLP

(57) ABSTRACT

A power electronics module includes a frame, a jet impingement cooler assembly, and a power electronics assembly. The frame includes a first surface, a second surface, a power electronics cavity within the first surface of the frame, a fluid inlet reservoir, and a fluid outlet reservoir. The fluid inlet and outlet reservoirs extend between the first surface of the frame and the second surface of the frame. The fluid inlet reservoir and the fluid outlet reservoir are configured to be fluidly coupled to one or more additional modular power electronics devices. The jet impingement assembly is sealed within the frame and fluidly coupled to the fluid inlet reservoir and the fluid outlet reservoir. The power electronics assembly includes at least one power electronics component, is positioned within the power electronics cavity, and is thermally coupled to the jet impingement cooler assembly. Power electronic module assemblies are also disclosed.

20 Claims, 14 Drawing Sheets

U.S. PATENT DOCUMENTS

| | | | |
|---|---|---|---|
| 5,210,440 A | 5/1993 | Long | |
| 5,228,502 A | 7/1993 | Chu et al. | |
| 5,260,850 A | 11/1993 | Sherwood et al. | |
| 5,269,372 A | 12/1993 | Chu et al. | |
| 5,270,572 A | 12/1993 | Nakajima et al. | |
| 5,394,299 A | 2/1995 | Chu et al. | |
| 5,546,274 A | 8/1996 | Davidson | |
| 5,912,800 A | 6/1999 | Sammakia et al. | |
| 5,983,997 A | 11/1999 | Hou | |
| 6,058,010 A | 5/2000 | Schmidt et al. | |
| 6,152,215 A * | 11/2000 | Niggemann | 165/166 |
| 6,167,948 B1 | 1/2001 | Thomas | |
| 6,167,952 B1 * | 1/2001 | Downing | 165/167 |
| 6,242,075 B1 | 6/2001 | Chao et al. | |
| 6,305,463 B1 | 10/2001 | Salmonson | |
| 6,333,853 B2 | 12/2001 | O'Leary et al. | |
| 6,377,461 B1 * | 4/2002 | Ozmat et al. | 361/704 |
| 6,386,278 B1 * | 5/2002 | Schulz-Harder | 165/167 |
| 6,431,260 B1 | 8/2002 | Agonafer et al. | |
| 6,459,581 B1 * | 10/2002 | Newton et al. | 361/700 |
| 6,501,654 B2 | 12/2002 | O'Connor et al. | |
| 6,580,609 B2 | 6/2003 | Pautsch | |
| 6,665,185 B1 | 12/2003 | Kulik et al. | |
| 6,828,675 B2 | 12/2004 | Memory et al. | |
| 6,903,931 B2 | 6/2005 | McCordic et al. | |
| 6,942,018 B2 | 9/2005 | Goodson et al. | |
| 6,952,346 B2 | 10/2005 | Tilton et al. | |
| 6,972,365 B2 | 12/2005 | Garner | |
| 6,986,382 B2 | 1/2006 | Upadhya et al. | |
| 6,988,535 B2 | 1/2006 | Upadhya et al. | |
| 6,992,382 B2 | 1/2006 | Chrysler et al. | |
| 6,994,151 B2 | 2/2006 | Zhou et al. | |
| 7,009,842 B2 * | 3/2006 | Tilton et al. | 361/699 |
| 7,017,654 B2 | 3/2006 | Kenny et al. | |
| 7,058,101 B2 | 6/2006 | Treusch et al. | |
| 7,071,408 B2 | 7/2006 | Garner | |
| 7,104,312 B2 | 9/2006 | Goodson et al. | |
| 7,119,284 B2 | 10/2006 | Bel et al. | |
| 7,184,269 B2 | 2/2007 | Campbell et al. | |
| 7,188,662 B2 | 3/2007 | Brewer et al. | |
| 7,204,303 B2 | 4/2007 | Thomas et al. | |
| 7,205,653 B2 | 4/2007 | Brandenburg et al. | |
| 7,212,409 B1 | 5/2007 | Belady et al. | |
| 7,250,674 B2 | 7/2007 | Inoue | |
| 7,295,440 B2 | 11/2007 | Ganev et al. | |
| 7,298,617 B2 | 11/2007 | Campbell et al. | |
| 7,298,618 B2 | 11/2007 | Campbell et al. | |
| 7,301,772 B2 * | 11/2007 | Tilton et al. | 361/699 |
| 7,302,998 B2 | 12/2007 | Valenzuela | |
| 7,327,570 B2 | 2/2008 | Belady | |
| 7,336,493 B2 | 2/2008 | Berkenbush et al. | |
| 7,355,277 B2 | 4/2008 | Myers et al. | |
| 7,365,981 B2 | 4/2008 | Myers et al. | |
| 7,385,817 B2 | 6/2008 | Campbell et al. | |
| 7,393,226 B2 | 7/2008 | Clayton et al. | |
| 7,397,662 B2 | 7/2008 | Oyamada | |
| 7,400,504 B2 | 7/2008 | Campbell et al. | |
| 7,414,844 B2 | 8/2008 | Wilson et al. | |
| 7,429,792 B2 | 9/2008 | Lee et al. | |
| 7,435,623 B2 | 10/2008 | Chrysler et al. | |
| 7,450,378 B2 | 11/2008 | Nelson et al. | |
| 7,486,514 B2 | 2/2009 | Campbell et al. | |
| 7,495,916 B2 | 2/2009 | Shiao et al. | |
| 7,551,439 B2 | 6/2009 | Peugh et al. | |
| 7,599,184 B2 | 10/2009 | Upadhya et al. | |
| 7,608,924 B2 * | 10/2009 | Myers et al. | 257/714 |
| 7,679,911 B2 | 3/2010 | Rapp | |
| 7,738,249 B2 | 6/2010 | Chan et al. | |
| 7,795,726 B2 | 9/2010 | Myers et al. | |
| 7,808,780 B2 | 10/2010 | Brunschwiler et al. | |
| 7,830,664 B2 | 11/2010 | Campbell et al. | |
| 7,835,151 B2 * | 11/2010 | Olesen | 361/689 |
| 7,839,642 B2 | 11/2010 | Martin | |
| 7,940,526 B2 * | 5/2011 | Schulz-Harder et al. | 361/699 |
| 7,952,875 B2 * | 5/2011 | Woody et al. | 361/699 |
| 8,077,460 B1 * | 12/2011 | Dede et al. | 361/699 |
| 8,199,505 B2 * | 6/2012 | Dede | 361/702 |
| 8,243,451 B2 * | 8/2012 | Dede et al. | 361/702 |
| 2002/0053726 A1 | 5/2002 | Mikubo et al. | |
| 2003/0196451 A1 | 10/2003 | Goldman et al. | |
| 2005/0121180 A1 | 6/2005 | Marsala | |
| 2005/0199372 A1 | 9/2005 | Frazer et al. | |
| 2005/0225938 A1 | 10/2005 | Montgomery et al. | |
| 2006/0002086 A1 | 1/2006 | Teneketges et al. | |
| 2006/0291164 A1 | 12/2006 | Myers et al. | |
| 2007/0034360 A1 | 2/2007 | Hall | |
| 2007/0041160 A1 | 2/2007 | Kehret et al. | |
| 2007/0074856 A1 | 4/2007 | Bhatti et al. | |
| 2007/0114656 A1 | 5/2007 | Brandenburg et al. | |
| 2007/0119565 A1 | 5/2007 | Brunschwiler et al. | |
| 2007/0177352 A1 | 8/2007 | Monfared et al. | |
| 2007/0188991 A1 | 8/2007 | Wilson et al. | |
| 2007/0230127 A1 | 10/2007 | Peugh et al. | |
| 2007/0236883 A1 | 10/2007 | Ruiz | |
| 2008/0093053 A1 | 4/2008 | Song et al. | |
| 2008/0245506 A1 | 10/2008 | Campbell et al. | |
| 2009/0032937 A1 | 2/2009 | Mann et al. | |
| 2009/0090490 A1 | 4/2009 | Yoshida et al. | |
| 2009/0108439 A1 | 4/2009 | Brandenburg et al. | |
| 2009/0294106 A1 | 12/2009 | Flotta et al. | |
| 2010/0000766 A1 | 1/2010 | Loiselet et al. | |
| 2010/0038774 A1 | 2/2010 | Zhang et al. | |
| 2010/0142150 A1 | 6/2010 | Campbell et al. | |
| 2010/0242178 A1 | 9/2010 | Goetting | |
| 2010/0246117 A1 | 9/2010 | Brunschwiler et al. | |
| 2010/0277868 A1 * | 11/2010 | Beaupre et al. | 361/700 |
| 2011/0216502 A1 * | 9/2011 | Dede | 361/689 |
| 2012/0048515 A1 * | 3/2012 | Bhunia et al. | 165/104.25 |
| 2012/0063091 A1 * | 3/2012 | Dede et al. | 361/699 |

OTHER PUBLICATIONS

U.S. Appl. No. 12/984,905, filed Jan. 5, 2011, titled: Cold Plate Assemblies and Power Electronics Modules.

U.S. Appl. No. 12/839,039, filed Jul. 19, 2010, titled: Heat Exchanger Fluid Distribution Manifolds and Power Electronics Modules Incorporating the Same.

U.S. Appl. No. 12/880,422, filed Sep. 13, 2010, titled: Cooling Apparatuses and Power Electronics Modules.

* cited by examiner

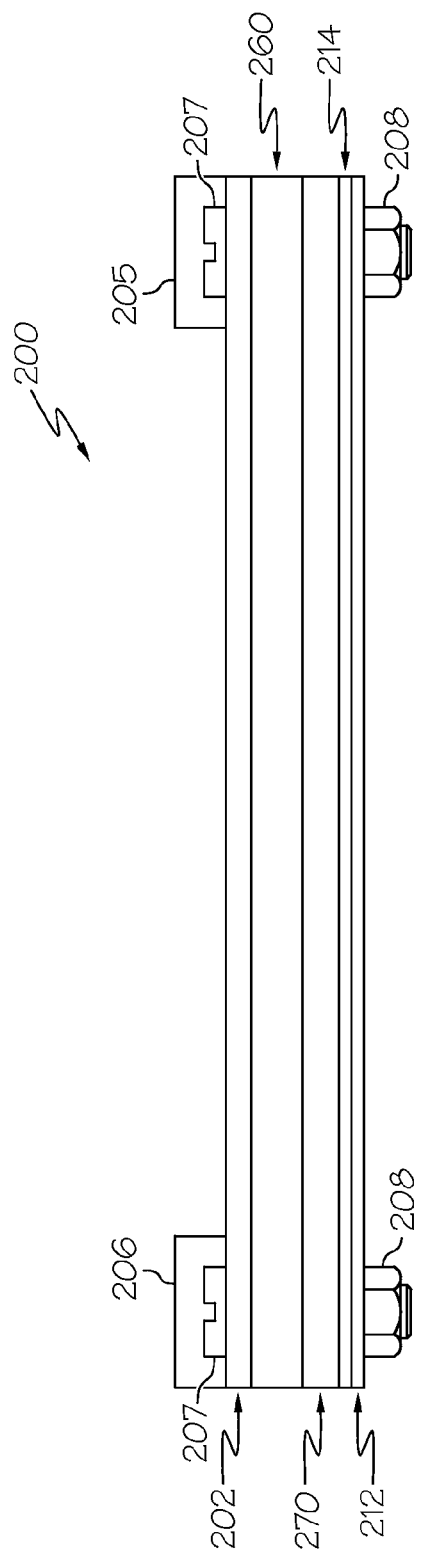

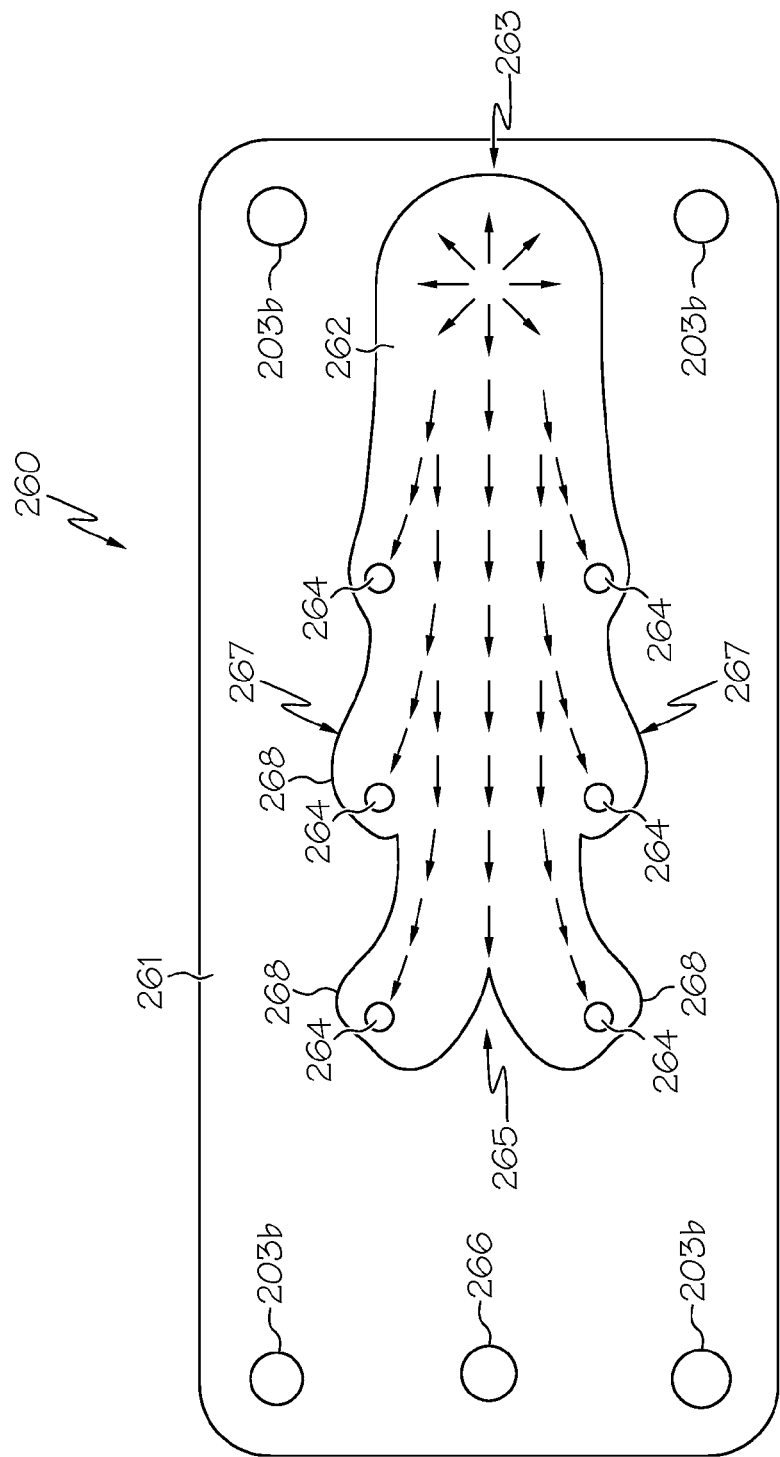

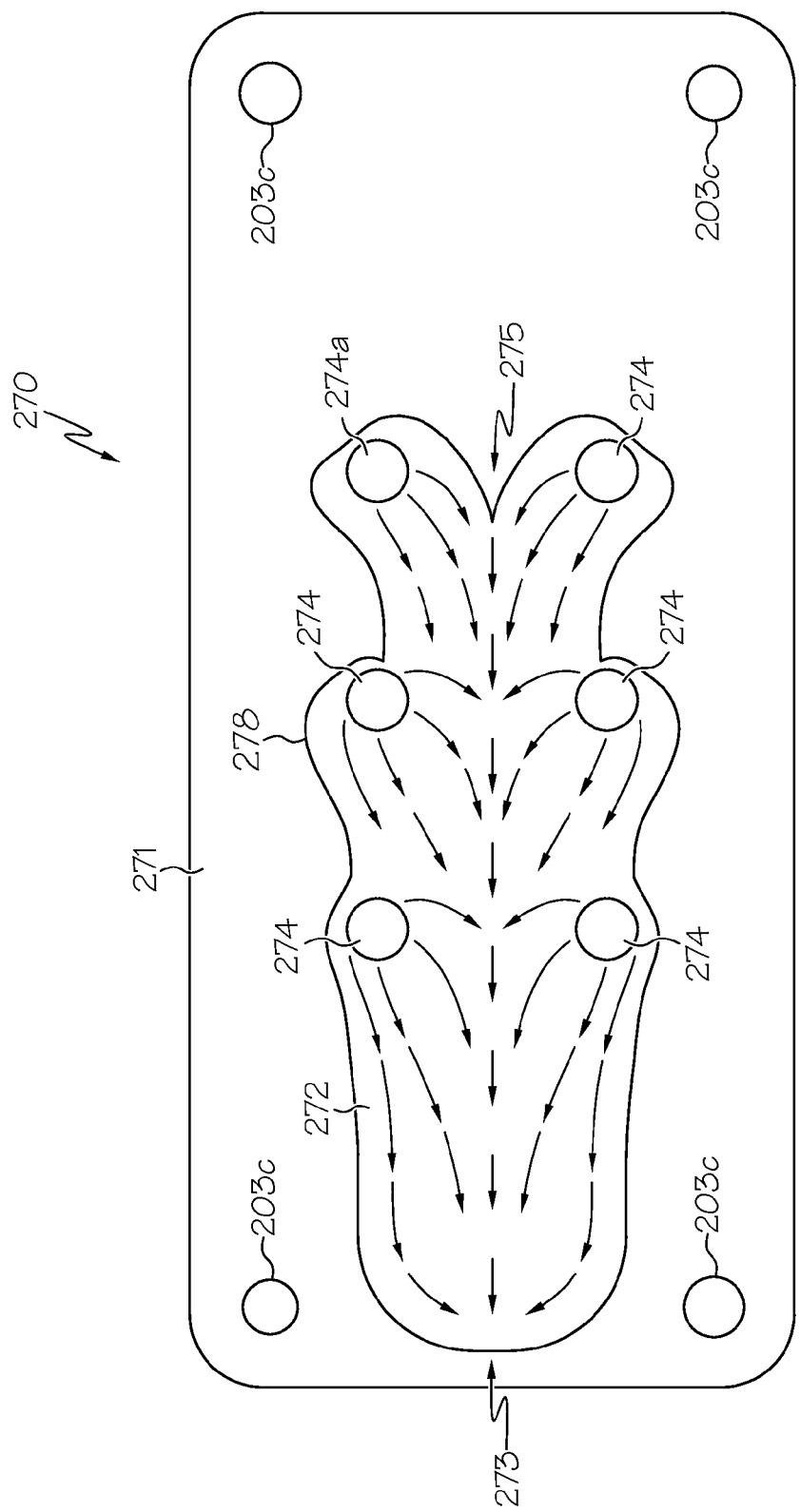

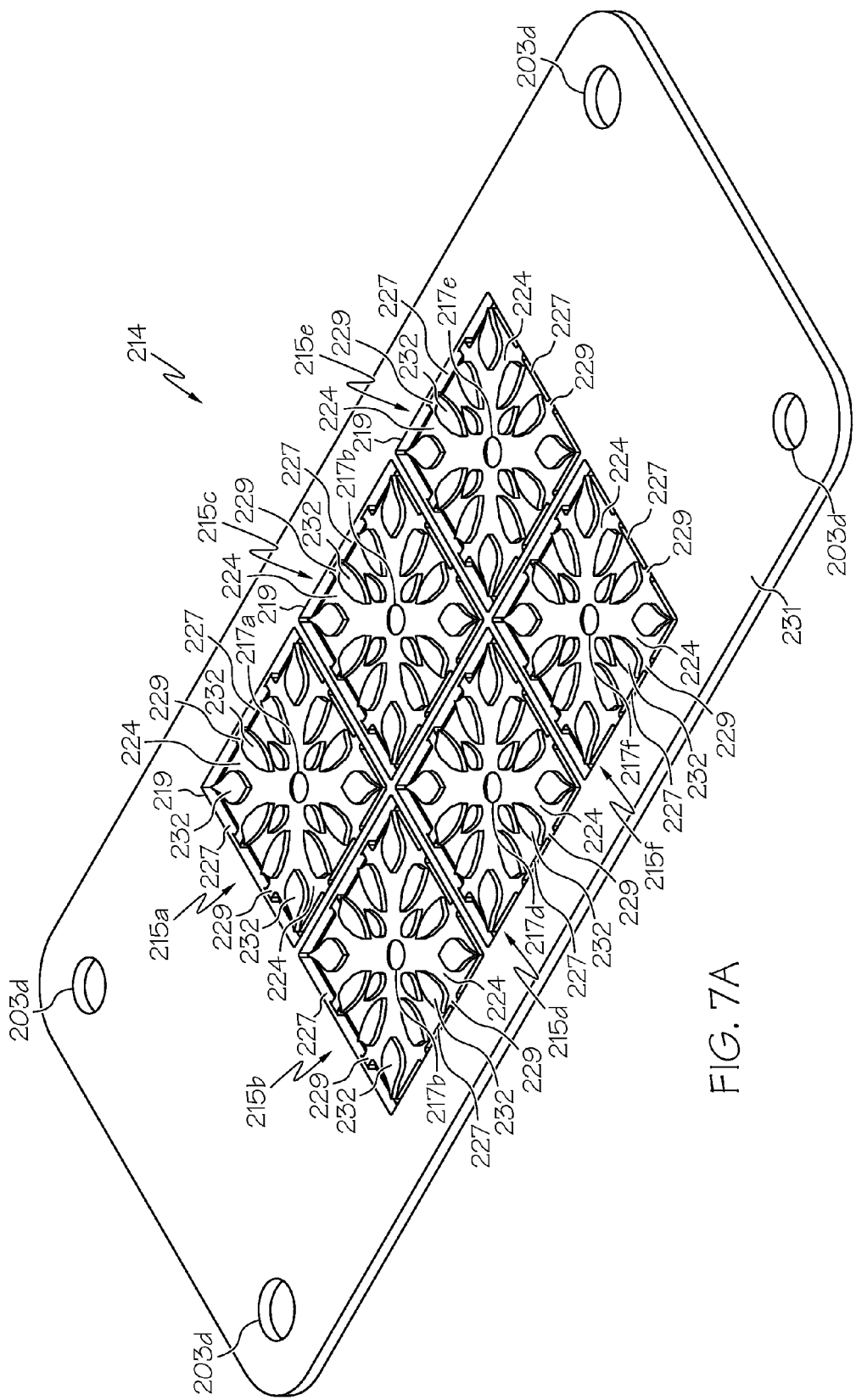

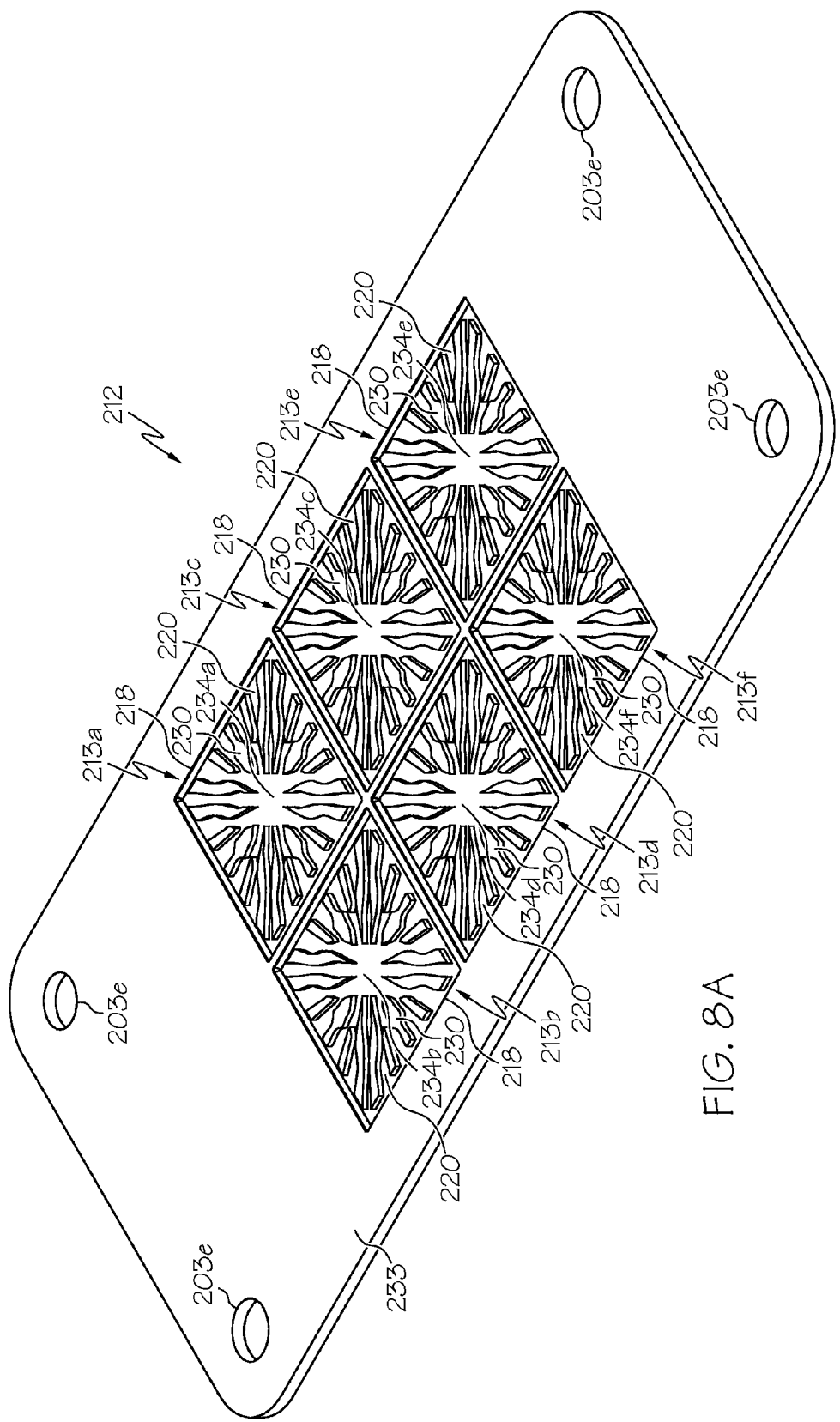

POWER ELECTRONICS MODULES AND POWER ELECTRONICS MODULE ASSEMBLIES

CROSS REFERENCE TO RELATED APPLICATIONS

This application is related to U.S. patent application Ser. No. 12/839,039 entitled "Heat Exchanger Fluid Distribution Manifolds and Power Electronics Modules Incorporating the Same," filed on Jul. 19, 2010, which is hereby incorporated by reference in its entirety, but does not claim priority thereto. This application is also related to U.S. patent application Ser. No. 12/880,386 entitled "Jet Impingement Heat Exchanger Apparatuses and Power Electronics Modules," filed on Sep. 13, 2010, which is hereby incorporated by reference in its entirety, but does not claim priority thereto. This application is also related to U.S. patent application Ser. No. 12/984,905 entitled "Cold Plate Assemblies and Power Electronics Module," filed on Jan. 5, 2011, which is hereby incorporated by reference in its entirety, but does not claim priority thereto.

TECHNICAL FIELD

The present specification generally relates to power electronics modules and more particularly, power electronics modules and assemblies having integral cooling structures.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, a jet of cooling fluid may be directed such that it impinges a surface of the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels.

Additionally, each power electronics application may require different power electronics components. For example, in the motor vehicle context, one hybrid electric vehicle (or electric vehicle) model may require an electric drive circuit having power electronics components that is different from that of an electric drive circuit of a second hybrid electric vehicle model. Currently, each motor vehicle model has a dedicated power electronics drive circuit assembly that is not shared with other motor vehicle models. A modular approach to power electronics drive circuit assemblies may be desired to reduce manufacturing costs.

Accordingly, a need exists for alternative power electronics modules and power electronics assemblies.

SUMMARY

In one embodiment, a power electronics module includes a frame, a jet impingement cooler assembly, and a power electronics assembly. The frame includes a first surface, a second surface opposite from the first surface, a power electronics cavity within the first surface of the frame, a fluid inlet reservoir, and a fluid outlet reservoir. The fluid inlet reservoir and the fluid outlet reservoir extend between the first surface of the frame and the second surface of the frame. The fluid inlet reservoir and the fluid outlet reservoir are configured to be fluidly coupled to one or more additional modular power electronics devices. The jet impingement assembly is sealed within the frame and fluidly coupled to the fluid inlet reservoir and the fluid outlet reservoir. The power electronics assembly includes at least one power electronics component, is positioned within the power electronics cavity, and is thermally coupled to the jet impingement cooler assembly.

In another embodiment, a power electronics module includes a frame and a multi-pass cold plate assembly. The frame includes a first surface, a second surface opposite from the first surface, a power electronics cavity within the first surface of the frame configured to maintain a power electronics assembly, a fluid inlet reservoir; and a fluid outlet reservoir. The fluid inlet reservoir and the fluid outlet reservoir extend between the first surface of the frame and the second surface of the frame, and the fluid inlet reservoir and the fluid outlet reservoir are configured to be fluidly coupled to one or more additional modular power electronics devices. The multi-pass cold plate assembly is sealed within the frame and fluidly coupled to the fluid inlet reservoir and the fluid outlet reservoir, and includes an inlet manifold layer fluidly coupled to the fluid inlet reservoir, an outlet manifold layer fluidly coupled to the fluid outlet reservoir, a target heat transfer layer, and a second-pass heat transfer layer.

In yet another embodiment, a power electronics module assembly includes a first power electronics module, a second power electronics module, a first cap layer, and a second cap layer. The first power electronics module is fluidly coupled to the second power electronics module. The first power electronics module and the second power electronics module each have a frame, a multi-pass cold plate assembly, a power electronics assembly. The frame includes a first surface, a second surface opposite from the first surface, a power electronics cavity within the first surface of the frame, a fluid inlet reservoir, and a fluid outlet reservoir. The fluid inlet reservoir and the fluid outlet reservoir extend between the first surface of the frame and the second surface of the frame. The multi-pass cold plate assembly is sealed within the frame and is fluidly coupled to the fluid inlet reservoir and the fluid outlet reservoir. The power electronics assembly includes at least one power electronics component, is positioned within the power electronics cavity, and is thermally coupled to the multi-pass cold plate assembly. The first cap layer is coupled to the first surface of the first power electronics module, and the second cap layer is coupled to the second surface of the second power electronics module. The second cap layer includes a fluid inlet structure fluidly coupled to the fluid inlet reservoir, a fluid outlet structure fluidly coupled to the fluid outlet reservoir. The fluid inlet reservoir of the first power electronics module is fluidly coupled to the fluid inlet reservoir of the second power electronics module, and the fluid outlet reservoir of the first power electronics module is fluidly coupled to the fluid outlet reservoir of the second power electronics module.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 3B schematically depicts a side view of the cold plate assembly depicted in FIG. 3A;

FIG. 5C schematically depicts a coolant fluid flow pattern of the inlet manifold layer depicted in FIGS. 5A and 5B;

FIG. 6C schematically depicts a coolant fluid flow pattern of the outlet manifold layer depicted in FIGS. 6A and 6B;

FIG. 7A schematically depicts a top perspective view of a second-pass heat transfer layer according to one or more embodiments shown and described herein;

FIG. 8A schematically depicts a top perspective view of a target heat transfer layer according to one or more embodiments shown and described herein;

DETAILED DESCRIPTION

Figure 1:
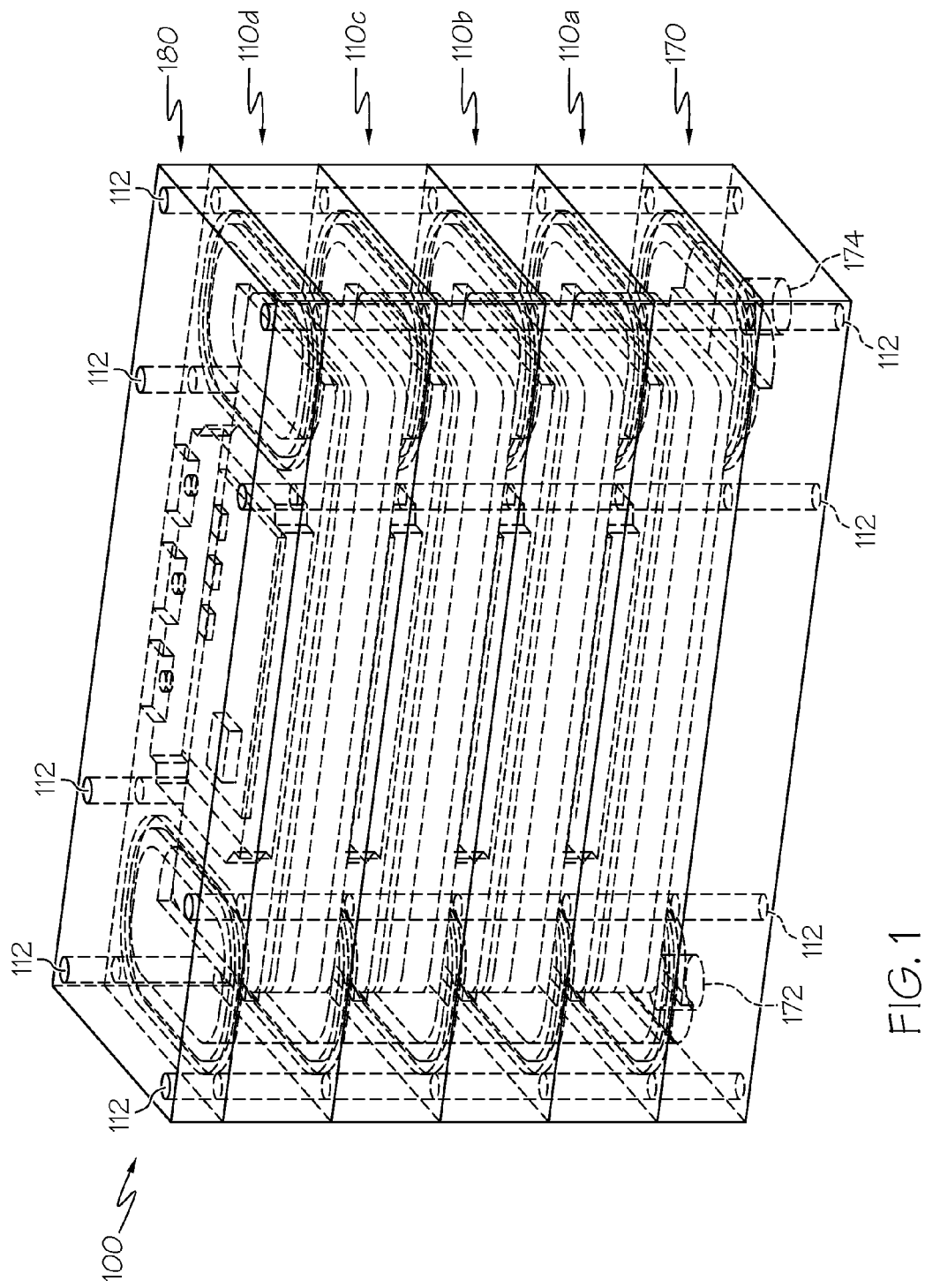
FIG. 1 schematically depicts a transparent perspective view of a power electronics module assembly having four power electronics modules according to one or more embodiments shown and described here.

FIG. 1 generally depicts one embodiment of a liquid cooled power electronics module assembly comprising a plurality of stackable power electronics modules each having a power electronics device assembly and an integral cold plate assembly. The power electronics module assembly may be expanded or reduced by adding or subtracting power electronics modules from the overall assembly. The power electronics modules are fluidly coupled together by integral fluid inlet and outlet reservoirs in a molded frame. The integral cold plate assembly is maintained within the frame, and is fluidly coupled to the fluid inlet and outlet reservoirs. The frame comprises a power electronics device cavity providing easy access to a heat transfer surface of the cold plate assembly so that power electronics devices (e.g., power semiconductors) and control circuits of various configurations may be added to the module, thereby providing a flexible design incorporating the power electronics devices and cooling apparatus in a single module that may be coupled to additional modules. Various embodiments of power electronics modules and power electronic module assemblies will be described in more detail herein.

Referring initially to FIG. 1, one embodiment of a power electronics module assembly is illustrated 100. The power electronics module assembly 100 may be configured as a drive circuit for a high-power application, such as an electric motor drive circuit of a hybrid-electric vehicle or an electric vehicle. Although embodiments may be described herein in the context of vehicular applications, embodiments are not limited thereto. Embodiments may be utilized in other high-power electrical applications.

Generally, the illustrated power electronics module assembly comprises a plurality of fluidly-coupled, stacked power electronics modules 110*a*-110*d*, a top, first cap layer 180, and a bottom, second cap layer 170. As described below, each power electronics module 110*a*-110*d* includes an integrated cold plate assembly and a power electronics device assembly. The stacked power electronics modules 110*a*-110*d*, the first cap layer 180, and the second cap layer 170 each have through-hole features 112 through which a plurality of fasteners (such as bolts, for example) may be disposed to maintain the components in a sealed manner. Any number of power electronics modules may be utilized. For example, one or more additional power electronics modules may be included with those illustrated in FIG. 1.

The first cap layer 180 is adjacent to a first layer of the power electronics module 110*d*, and seals the fluid reservoirs (described in more detail below) of power electronics module 110*d* to maintain coolant fluid (e.g., water, ethylene-glycol mixes, etc.) within the power electronics module assembly 100. The second cap layer 170, which is adjacent to a second surface of power electronics module 110*a*, is also utilized to maintain the coolant fluid within the power electronics module assembly 100. The second cap layer 170 further comprises a fluid inlet structure 172 and a fluid outlet structure 174. The fluid inlet structure 172 and fluid outlet structure 174 may comprise fluid coupling devices such as valves, nozzles, and the like, to enable the power electronics module assembly 100 to be coupled to a coolant fluid source (e.g., a vehicle radiator system, not shown).

The first cap layer 180 and the second cap layer 170 may be made of a thermally conductive material, such as a metallic material (e.g., copper, aluminum, etc.) or a thermally conductive, dielectric plastic composite material, for example.

Figure 2:
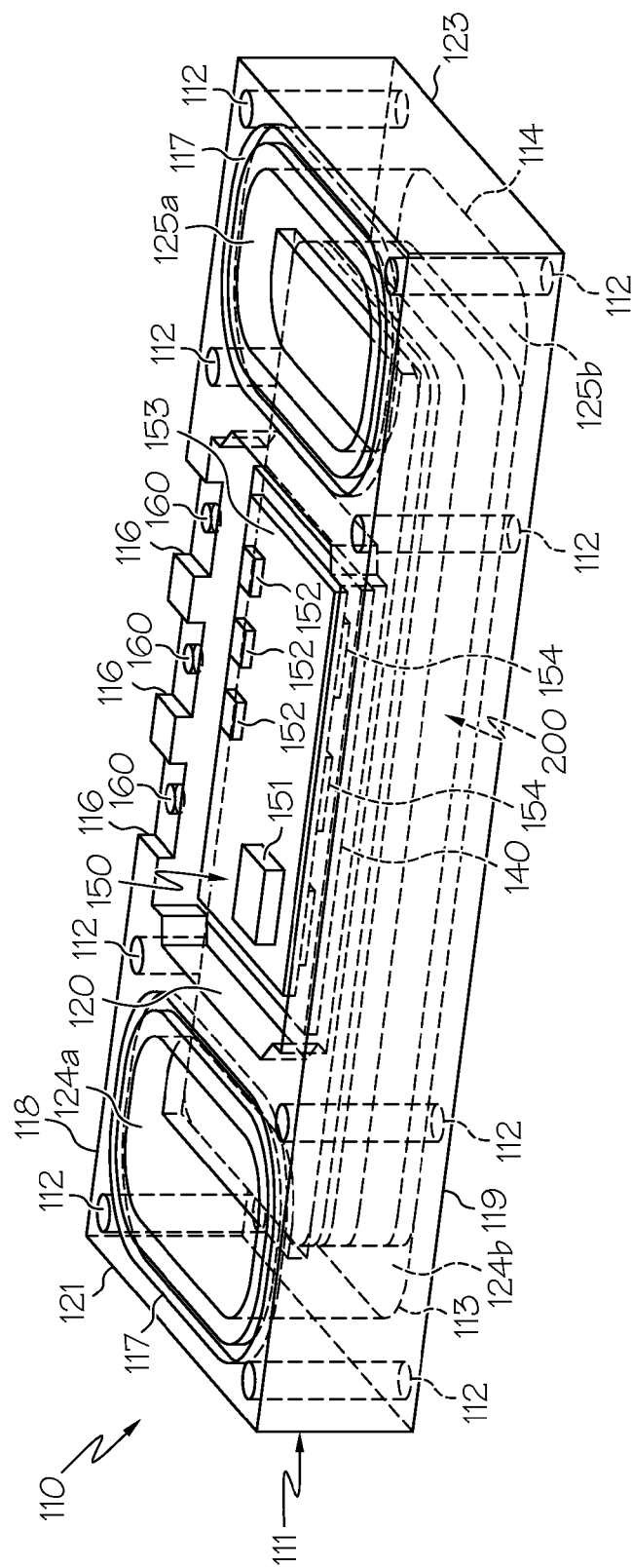
FIG. 2 schematically depicts a transparent perspective view of a power electronics module according to one or more embodiments shown and described herein.

Referring now to FIG. 2, an individual power electronics module 110 is illustrated in greater detail. The illustrated embodiment comprises a thermally conductive frame 111 having a first surface 118 and a parallel second surface 119, and a first end 121 and a parallel second end 123. Although the frame 111 is illustrated having a rectangular, box-like shape, embodiments are not limited thereto. For example, the walls of the frame 111 may be curved or have other arbitrary features.

In one embodiment, the frame 111 is a unitary structure molded from a thermally conductive plastic, such as a plastic composite material comprising a polymer matrix with a distribution of microscale particles (e.g. ceramic or graphite) for enhanced conductive heat transfer through the frame 111. In an alternative embodiment, the frame 111 is a two piece structure (or multiple-piece structure) that may be assembled to make a power electronics module 110. For example, the frame 111 illustrated in FIG. 2 may have a top half and a bottom half that are maintained together to form a unitary structure. In another embodiment, the frame is made of a cast and/or machined metal material, such as copper or aluminum, for example. In an embodiment that the frame 111 comprises two halves made of a metal material, the two halves may be coupled together by any bonding techniques, such as by soldering, braze bonding, diffusion bonding, or ultrasonic bonding.

Maintained within the frame 111 is a cold plate assembly 200 that circulates coolant fluid to remove heat flux generated by the power electronics devices 154 of the power electronics module 110. The cold plate assembly 200 should be made of a thermally conductive material to facility the transfer of heat from the power electronics device(s) to the coolant fluid circulating therein. The cold plate assembly 200 may be fabricated from copper, aluminum, or other metal or metal alloys. In one embodiment, the frame 111 comprises a thermally conductive plastic material that is molded over the cold plate assembly 200. The cold plate assembly 200 is therefore maintained within the frame in a watertight manner. In an alternative embodiment, the frame 111 comprises two halves, each defining a recess in which the cold plate assembly 200 is disposed. The two halves may be brought together to enclose the cold plate assembly 200. A sealant material such as silicone may be applied to the recess and cold plate assembly 200 to maintain the cold plate assembly 200 within the frame 111 in a watertight manner.

The cold plate assembly 200 may take on a variety of cooling structure configurations. In one embodiment, the cold plate assembly 200 comprises a jet impingement cooler assembly wherein a jet of coolant fluid strikes a target surface within the cold plate assembly 200. In another embodiment, a channel-based cold plate assembly 200 may comprise a plurality of channels through which the coolant fluid flows to receive heat generated by the power electronics devices. The internal components of the cold plate assembly 200 may utilize any number of heat sinking techniques and structures. In yet another embodiment, the cold plate assembly may comprise elements of both jet impingement and channel-based designs. Particular embodiments of the internal components of various embodiments of cold plate assemblies are described below with reference to FIGS. 3A-9.

The frame 111 also comprises a power electronics cavity 120 within the first surface of the frame 111. The power electronics cavity 120 is shaped and configured to accept a power electronics assembly 150. Accordingly, the size and shape of the power electronics cavity 120 may depend on the shape and size of the power electronics assembly 150. The power electronics cavity 120 exposes a surface of the cold plate assembly 200 onto which power electronics devices 154 may be thermally coupled.

As shown in FIG. 2, the power electronics assembly 150 may comprise one or more power electronics devices 154, a circuit board 153, and various control circuit components 151 and 152. The power electronics device or devices 154 may be one or more semiconductor devices that may include, without limitation, IGBTs, RC-IGBTs, MOSFETs, power MOSFETs, diodes, transistors, and/or combinations thereof. The power electronics device(s) 154 may be mounted on a first side of the circuit board 153 such that one surface of the power electronics device(s) 154 is thermally coupled to the cold plate assembly 200. The control circuit components 151 and 152 may be mounted on a side of the circuit board 153 that is opposite from the power electronics devices 154. The control circuit components 152 may include discrete and active components that are configured to control or otherwise drive the power electronics devices 154. The power electronics cavity 120 enables the power electronics module 110 to include the power electronics devices 154 as well as the control circuit in one compact package.

Further, the frame 111 of the illustrated power electronics module 110 comprises three bus bar recesses 116 that expose bus bars 160 for power connection to the power electronics devices 154 and control circuit components 152. For example, the bus bars may provide U-V-W connections to the power electronics devices 154. The bus bar recesses 116 provide for the connection lead wires or cables (not shown) to the exposed bus bars 160.

As described above, the power electronics devices 154 may be thermally coupled to the exposed surface of the cold plate assembly 200. In one embodiment, the power electronics devices 154 are thermally coupled to the cold plate assembly 200 via an intermediate, thermally conductive substrate layer 140 (e.g., epoxy, direct bonded copper (DBC), direct bonded aluminum (DBA), or similar). The power electronics devices 154 may be bonded to the substrate layer 140 by bonding techniques such as soldering, transient liquid phase bonding (TLP), and nano-silver sintering, for example.

Still referring to FIG. 2, the frame 111 of the illustrated power electronics module 110 comprises a fluid inlet reservoir 113 and a fluid outlet reservoir 114 that are hollow and extend from the first surface 118 to the second surface 119. The fluid inlet reservoir 113 and fluid outlet reservoir 114 having fluid inlet and outlet reservoir openings 124a/124b, and 125a/125b at the first and second surfaces 118, 119, respectively. The cold plate assembly 200 is fluidly coupled to the inlet and fluid outlet reservoirs 113, 114. A perimeter of the openings 124a, 124b, 125a, and 125b have a ring-shaped recess 117 into which a fluidic seal, such as a o-ring (not shown), may be positioned to provide for a watertight seal between interfacing, stacked power electronics modules 110 that make up the full power electronics module assembly 100 (see FIG. 1).

The fluid inlet reservoir 113 is configured to accept coolant fluid and the fluid outlet reservoir is configured to exhaust coolant fluid from the power electronics module 110 and the overall power electronics module assembly 100. As depicted in FIG. 1 (as well as FIG. 10, discussed below), coolant fluid may enter the fluid inlet reservoir 113 from either the fluid inlet structure 172 of the second cap layer 170 or from a fluid inlet reservoir of a previous power electronics module in the stack. The coolant fluid may either flow into a cold plate assembly 200 or through the fluid inlet reservoir from the current power electronics module into the fluid inlet reservoir of the next power electronics module in the stack. Coolant fluid flowing from each cold plate assembly flows into respective fluid outlet reservoirs and out of the fluid outlet structure 174 of the second cap layer 170.

FIGS. 3A-9 schematically illustrate interior structures of jet impingement, multi-pass cold plate assembly according to one embodiment. However, other heat-exchanger configurations of the cold plate assembly are possible.

Figure 3A:
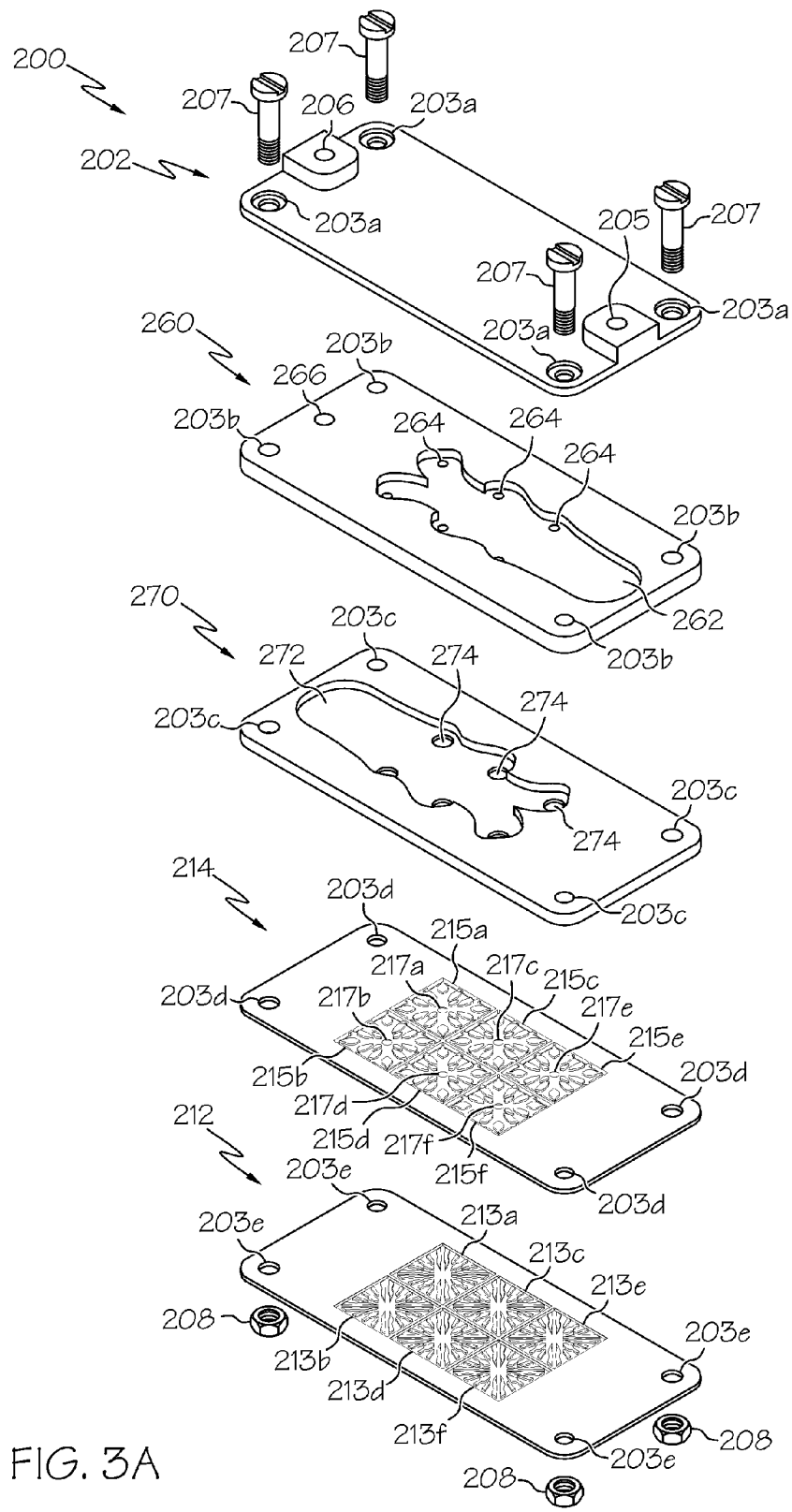
FIG. 3A schematically depicts an exploded perspective view of a cold plate assembly according to one or more embodiments shown and described herein.

Referring now to FIGS. 3A and 3B, an exemplary cold plate assembly 200 is illustrated. FIG. 3A is an exploded view of an embodiment of a cold plate assembly 200, and FIG. 3B is a side view of the cold plate assembly depicted in FIG. 3A. The illustrated cold plate assembly is configured as a jet impingement, multi-pass cold plate assembly. Generally, the cold plate assembly 200 comprises a sealing layer 202 that is thermally coupled to an inlet manifold layer 260. It is noted that the various layers of the cold plate assembly 200 described herein may be thermally coupled to one another and fluidly sealed by a variety of methods. For example, the sealing layer 202 may be thermally coupled to the inlet manifold layer 260 by a brazing process in which a thin metal alloy is used to form a braze joint between the two structures. Solder bonding, diffusion bonding, or ultrasonic bonding may also be utilized to thermally couple the various layers of the cold plate apparatus 200. As illustrated in FIGS. 3A and 3B, fasteners such as bolts 207 and nuts 208 may also be utilized along with fluidic seals, such o-rings or gaskets (not shown), to maintain the various layers in a thermally-coupled and fluidly-sealed relationship.

The cold plate assembly 200 further comprises an outlet manifold layer 270 that is thermally coupled to the inlet manifold layer 260, a second-pass heat transfer layer 214 that is thermally coupled to the outlet manifold layer 270, and a target heat transfer layer 212 that is thermally coupled to the second-pass heat transfer layer 214. As depicted in FIG. 3B, all of the layers are stacked together to form a cold plate assembly 200 that may be coupled to a power electronics device at the target heat transfer layer 212 that is exposed in the power electronics cavity 120 of the frame 111 (FIG. 2).

Figure 4:
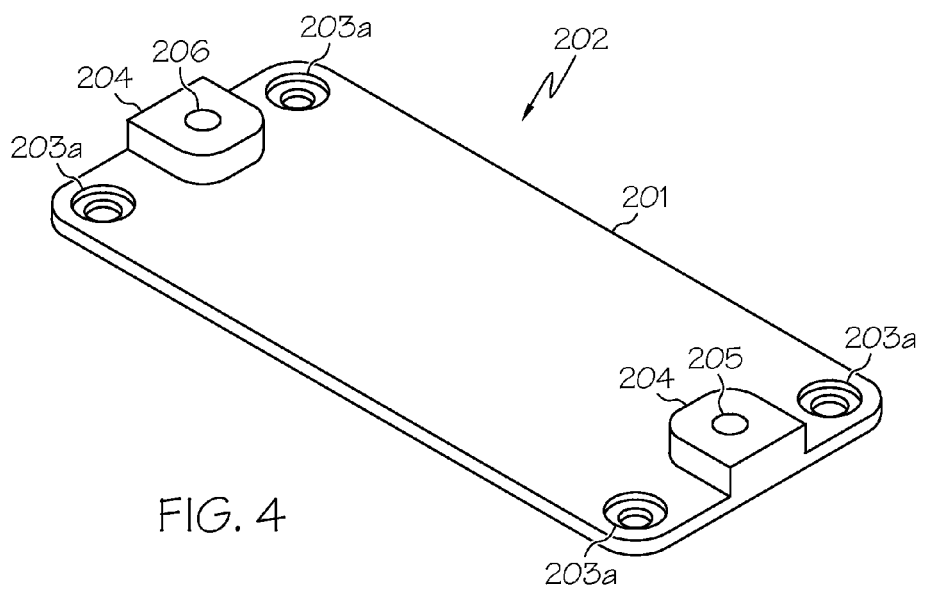
FIG. 4 schematically depicts a top perspective view of a sealing layer according to one or more embodiments shown and described herein.

Referring now to FIGS. 3A and 4, the sealing layer 202 comprises a fluid inlet 205 and a sealing layer coolant fluid outlet 206 configured as holes that extend fully through the sealing layer 202. As described above, the coolant fluid inlet 205 and the sealing layer fluid outlet 206 are fluidly coupled to the fluid inlet reservoir 113 and the fluid outlet reservoir 114 of the frame 111, respectively. The coolant fluid inlet 205 and the sealing layer fluid outlet 206 that may have a variety of configurations that enable coolant fluid to enter and exit the cold plate assembly 200. As illustrated in FIG. 3A, the sealing layer 202 may comprise mounting holes 203a that may accept bolts 207 to maintain the various layers of the cold plate assembly 200. The mounting holes 203a of the sealing layer 202 may be counter-bore holes in which the heads of the bolts 207 may be positioned. In an alternative embodiment, the sealing layer 202 may not have mounting holes and may be thermally coupled to the inlet manifold layer 260 by soldering, brazing, diffusion bonding, or ultrasonic bonding.

The sealing layer 202 may be made of a thermally conductive material including, but not limited to, copper, aluminum, thermally enhanced composite materials, and polymer composite materials. The sealing layer 202 may be formed by a variety of manufacturing processes including, but not limited to, molding processes, machining processes, stamping processes or similar processes to achieve the desired shape and configuration.

Figure 5A:
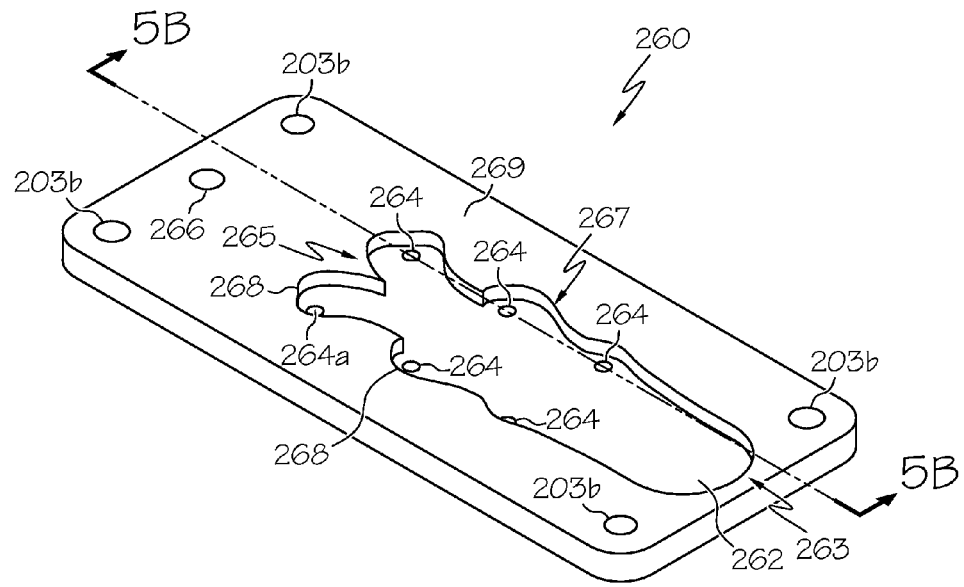
FIG. 5A schematically depicts a top perspective view of an inlet manifold layer according to one or more embodiments shown and described herein.
Figure 5B:
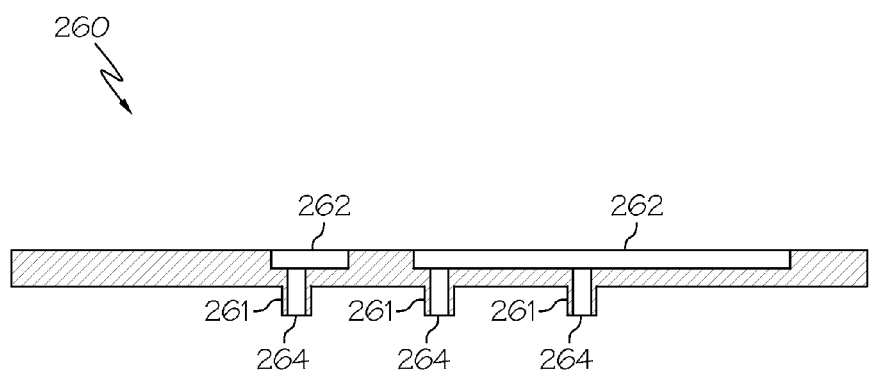
FIG. 5B schematically depicts a cross section view of the inlet manifold layer depicted in FIG. 5A.
Figure 6A:
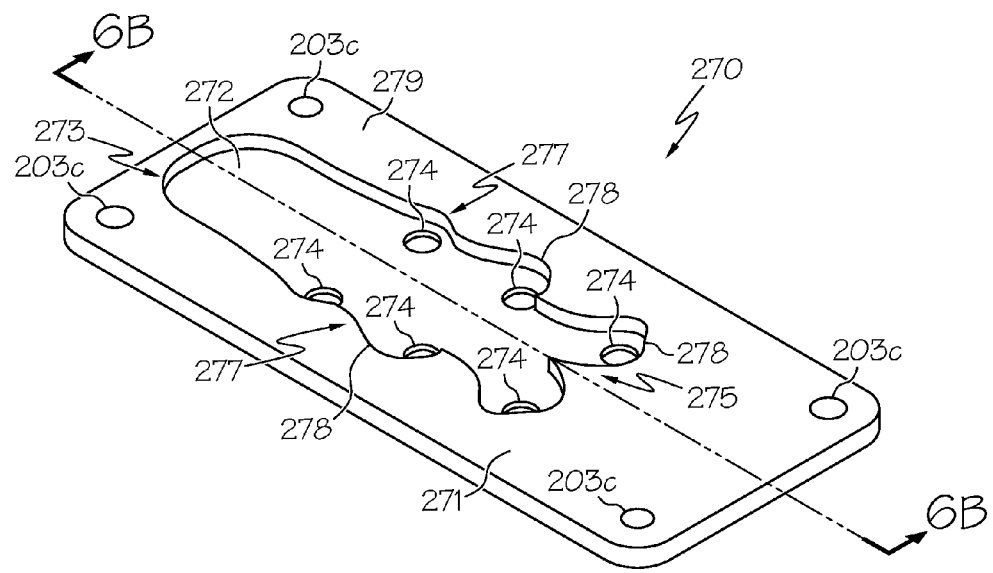
FIG. 6A schematically depicts a top perspective view of an outlet manifold layer according to one or more embodiments shown and described herein.
Figure 6B:
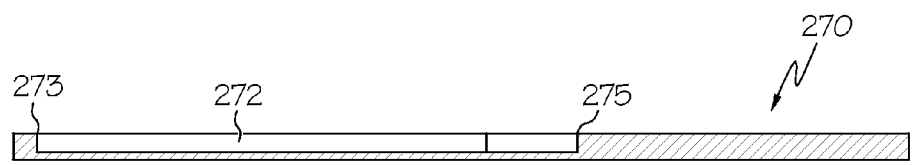
FIG. 6B schematically depicts a cross section view of the outlet manifold layer depicted in FIG. 6A.

Referring to FIGS. 3A, 5A, and 5B, the inlet manifold layer 260 generally comprises an inlet channel 262 and a coolant fluid outlet 266. The illustrated inlet manifold layer 260 further comprises mounting holes 203b operable to receive the bolts 207. The coolant fluid outlet 266 is configured as a hole that fully extends through the inlet manifold layer 260 and is positioned such that it is in fluid communication with the sealing layer fluid outlet 206 when the cold plate assembly 200 is in an assembled state.

The inlet channel 262 is configured as a recess within the inlet manifold layer 260 that receives coolant fluid from the coolant fluid inlet 205. As depicted in FIGS. 3A and 5A, the coolant fluid inlet 205 is in fluid communication with a first end 263 of the inlet channel 262. The illustrated inlet channel 262 comprises a plurality of fluid inlet holes 264 that are located along the inlet channel 262. The fluid inlet holes 264 extend fully through the inlet manifold layer 260. In one embodiment, as illustrated in FIG. 5B, the inlet manifold layer 260 comprises impingement jet nozzles 261 that are in fluid communication with the fluid inlet holes 264 and extend from a body 269 of the inlet manifold layer 260. The fluid inlet holes 264 extend through the cylindrical impingement jet nozzles 261 and are operable to pass coolant fluid therethrough. In another embodiment, the impingement jet nozzles 261 are incorporated as cylindrical features of the second-pass heat transfer layer 214.

The inlet manifold layer 260 may be made of a thermally conductive material, and may be manufactured using a variety of manufacturing processes, as described above with respect to the sealing layer 202. As described in more detail below, the inlet manifold layer 260 is thermally coupled to the outlet manifold layer 270 such that the impingement jet nozzles 261 pass through the fluid outlet holes 274 of the outlet manifold layer 270 and either pass through the central fluid outlet regions 217 of the second-pass heat transfer layer 214 in a nesting arrangement, or rest on a surface of the heat transfer layer 214 at the central fluid outlet regions 217.

The fluid inlet holes 264 are located in two rows that extend from the first end 263 toward a second end 265 that is opposite from the first end 263. In another embodiment, the plurality of fluid inlet holes may be arranged in a single row, or in more than two rows. Further, although the embodiment illustrated in FIGS. 3A, 5A, and 5C have six fluid inlet holes 264, more or fewer fluid inlet holes 264 may be utilized.

The distance between the first end 263 where the coolant fluid enters the inlet channel 262 and the fluid inlet holes 264 varies from fluid inlet hole to fluid inlet hole. For example, the distance between the first end 263 and the fluid inlet holes 264 increases along the rows of plurality of fluid inlets toward second end 265. Because the distances between the first end 263 and the various fluid inlet holes are unequal, a coolant fluid chamber having straight walls would cause uneven coolant flow rates at each fluid inlet hole 264, as well as a relatively larger total pressure drop.

The inlet channel 262 further comprises a plurality of serpentine inlet channel walls 267. The serpentine inlet channel walls 267 are defined by a plurality of individual inlet spline features 268 that are located close to the fluid inlet holes 264. A spline feature is defined by a curved wall portion that extends from one sharp angle or transition point to another sharp angle or transition point. The shape and size of the serpentine inlet channel walls 267 and corresponding inlet spline features 268 are optimized to reduce the total pressure drop within the inlet channel 262, as well as provide for a uniform coolant fluid flow rate at each fluid inlet hole 264. The term optimized, as used herein, means that the serpentine walls are geometrically designed to provide substantially uniform coolant fluid flow rate at each fluid inlet hole. The serpentine inlet channel walls 267 are configured to guide the coolant fluid uniformly throughout the inlet channel 262.

The shape of the inlet spline features 268 corresponds to the expected flow velocity field within the inlet channel 262. FIG. 5C illustrates expected coolant fluid flow within the inlet channel 262. The arrows indicate flow direction of the coolant fluid. The coolant fluid enters the inlet channel 262 at the first end 263 and is then routed toward the fluid inlet holes 264 toward the second end 265. The embodiment illustrated in FIGS. 3A and 5A-5C utilizes the serpentine inlet channel walls 267 to optimize the area as well as the walls of the inlet channel 262 to obtain even coolant fluid flow distribution and minimize pressure loss.

The geometric shape of the serpentine inlet channel walls 267 are designed to maintain substantially equal coolant fluid velocity and pressure at the fluid inlet holes despite the unequal distances between each fluid inlet hole and the first end where the coolant fluid enters the inlet channel 262. In such a manner, coolant fluid may be evenly and efficiently distributed throughout the inlet channel 262.

In an alternative embodiment, a majority of inlet channel 262 is fully enclosed by the body 269 of the outlet manifold layer 270, and the sealing layer is not utilized. In this embodiment, the coolant fluid inlet 205 is a component of the outlet manifold layer 270. Coolant fluid may enter the inlet channel 262 via a coolant fluid inlet at the outlet manifold layer 270. This embodiment may be fabricated using a molding process, for example.

Referring now to FIGS. 3A and 6A-6C, the outlet manifold layer 270 generally comprises an outlet channel 272 and mounting holes 203c operable to receive the bolts 207. Similar to the inlet channel 262 described above, the outlet channel 272 is configured as a recess within the outlet manifold layer 270. The position of the fluid outlet holes 274 correspond to the position of the inlet holes 264 such that the two sets of holes are aligned with each other when in an assembled state. The illustrated outlet channel 272 comprises a plurality of fluid outlet holes 274 that are located along the outlet channel 272. The fluid outlet holes 274 extend fully through the outlet manifold layer 270. The fluid outlet holes 274 are larger in diameter than the fluid inlet holes 264 to accept the impingement jet nozzles such that fluid may flow from the second-pass heat transfer layer 214 through the fluid outlet holes 274 and around the impingement jet nozzles 261, as described in more detail below. The outlet manifold layer 270 may be made of thermally conductive materials, and may be manufactured using a variety of manufacturing processes.

The fluid outlet holes 274 are located in two rows that extend from the second end 275 toward the first end 273 that is opposite from the second end 275. In another embodiment, the plurality of fluid inlet holes may be arranged in a single row, or in more than two rows. Further, although the embodiment illustrated in FIGS. 3A, 6A and 6C have six fluid outlet holes 274, more or fewer fluid outlet holes 274 may be utilized.

As described above with respect to the inlet channel 262, the distance between the first end 273 where the coolant fluid exits the outlet channel 272 and the fluid outlet holes 274 varies from fluid outlet hole to fluid outlet hole. Because the distances between the first end 273 and the various fluid outlet holes are not equal, a coolant fluid chamber having straight walls would cause uneven coolant flow rates from each fluid outlet hole 274, as well as a relatively larger total pressure drop.

The outlet channel 272 also comprises a plurality of serpentine outlet channel walls 277 defined by a plurality of individual outlet spline features 278 that are located close to the fluid outlet holes 274. The shape and size of the serpentine outlet channel walls 277 and corresponding outlet spline features 278 are optimized to reduce the total pressure drop within the outlet channel 272, as well as provide for a uniform coolant fluid flow rate of coolant fluid flowing from each fluid outlet hole 274.

The shape of the outlet spline features 278 corresponds to the expected flow velocity field within the outlet channel 272. FIG. 6C illustrates expected coolant fluid flow within the outlet channel 272. The arrows indicate flow direction of the coolant fluid. The coolant fluid enters the outlet channel 272 through a ring-like opening defined by the fluid outlet holes 274 and around the impingement jet nozzles 261 (see FIG. 9). The coolant fluid is then routed toward the first end 273 where it is forced upwardly through the coolant fluid outlet 266 of the inlet manifold layer 260 and the sealing layer fluid outlet 206 of the sealing layer 202, both of which are in fluid communication with the outlet channel 272.

The geometric shapes of the serpentine outlet channel walls 277 are designed to maintain substantially equal coolant fluid velocity and pressure at the fluid outlet holes despite the unequal distances between each fluid outlet hole 274 and the first end 273 where the coolant fluid exits the outlet channel 272. In such a manner, coolant fluid may be evenly and efficiently distributed throughout the outlet channel 272.

Referring now to FIGS. 3A and 7A, the second-pass heat transfer layer 214 generally comprises a plurality of second-pass heat transfer cells 215a-215f, mounting holes 203d, and transition channels 227 located around the perimeter of each second-pass heat transfer cell 215a-215f. The number of second-pass heat transfer cells 215a-215f may depend on the number of fluid inlet holes 264 and fluid outlet holes 274 and is not limited to six as depicted in FIGS. 3A and 7A.

Each of the second-pass heat transfer cells comprises a plurality of radially-extending second-pass heat transfer layer microchannels 224 that are defined by a plurality of second-pass heat transfer layer fins 232. Each second-pass heat transfer cell further comprises a central fluid outlet region 217a-217f that comprises a hole of which an impingement jet nozzle is aligned with or positioned within. The hole of the central fluid outlet region 217a-217f may have a diameter that closely matches that of an inner diameter of the impingement jet nozzles. In an alternative embodiment, the impingement jet nozzles may be integrally formed as hollow cylinders within the central fluid outlet region 217a-217f of the second-pass heat transfer cells 215a-215f, rather than integrally formed in the inlet manifold layer 260.

The radially-extending second-pass heat transfer layer microchannels 224 are defined by a plurality of second-pass heat transfer layer fins 232 of different shapes and sizes. The second-pass heat transfer layer fins 232 have curved walls and are geometrically optimized to reduce pressure drop, enhance heat transfer, and direct the coolant fluid toward a central fluid outlet region 217a-217f. The second-pass heat transfer layer fins 232 defining the second-pass heat transfer layer microchannels 224 have curved walls and vary in size and shape. By selecting the geometrical configuration of the second-pass heat transfer layer fins 232, the coolant fluid may more efficiently flow within the second-pass heat transfer layer microchannels 224. Curved walls also increase the surface area in which the coolant fluid is in contact with the second-pass heat transfer cells 215a-215f, thereby increasing thermal transfer from the second-pass heat transfer layer 214 to the coolant fluid. The geometric configuration of the second-pass heat transfer layer fins 232 and resulting second-pass heat transfer layer microchannels 224 positioned therebetween may be determined by computer simulation, for example. The geometric configuration utilized for the second-pass heat transfer layer microchannels 224 may depend on parameters such as flow resistance, the type of coolant fluid, and the desired maximum operating temperature of the power electronics device, for example.

The transition channels 227 extend fully through the second-pass heat transfer layer 214. In one embodiment, the second-pass heat transfer cells 215a-215f may be maintained by webbing features 229 that hold the second-pass heat transfer cells 215a-215f to a body of the second-pass heat transfer layer 214. The transition channels 227 may be configured as gaps between the webbing features 229. As described in more detail below, the transition channels 227 fluidly couple the second-pass heat transfer layer 214 to the target heat transfer layer 212.

Figure 7B:
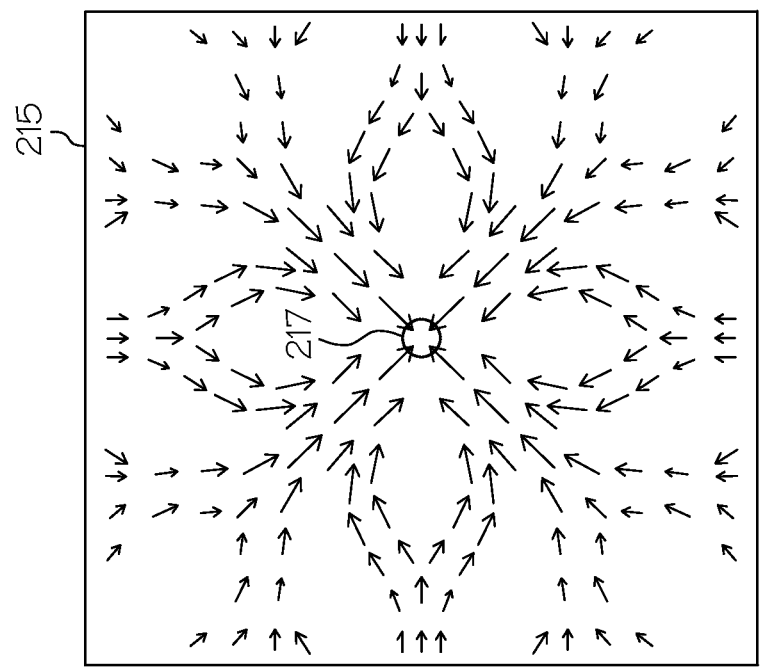
FIG. 7B schematically depicts a coolant fluid flow pattern of a second-pass heat transfer cell of the second-pass heat transfer layer depicted in FIG. 7A.

FIG. 7B illustrates a coolant fluid flow pattern of a single second-pass heat transfer cell 215. The coolant fluid flows from the perimeter to the central fluid outlet region 217. Fluid flow within the second-pass heat transfer layer 214 will be described in more detail below.

The second-pass heat transfer layer 214 may also be made of a thermally conductive material that allows for the transfer of thermal energy from the second-pass heat transfer layer 214 to the coolant fluid. It is noted that each layer may be made of a different thermally conductive material. As described above with respect to the sealing layer 202, exemplary materials include, but are not limited to, copper, aluminum, thermally enhanced composite materials, and polymer composite materials. The second-pass heat transfer layer 214 and corresponding components may also be formed by a molding process, a machining process, stamping process, or similar processes to achieve the desired shape and configuration. As an example and not a limitation, the second-pass heat transfer layer microchannels 224 may be formed by a machining process.

Referring now to FIGS. 3A and 8A, the target heat transfer layer 212 generally comprises mounting holes 203e and a plurality of target heat transfer cells 213a-213f. Each target heat transfer cell 213a-213f comprises an impingement region 234a-234f, target heat transfer cell walls 218, and a plurality of radially-extending target heat transfer layer microchannels 220. The radially-extending target heat transfer layer microchannels 220 are defined by a plurality of target heat transfer layer fins 230 of different shapes and sizes. Like the second-pass heat transfer layer fins 232, the target heat transfer layer fins 230 have curved walls and are geometrically optimized to reduce pressure drop, enhance heat transfer, and direct the coolant fluid toward the perimeter of the target heat transfer layer 212. By selecting the geometrical configuration of the target heat transfer layer fins 230, the coolant fluid may more efficiently flow within the target heat transfer layer microchannels 220. Curved walls also increase the surface area in which the coolant fluid is in contact with the target heat transfer layer 212, thereby increasing thermal transfer from the target heat transfer layer 212 to the coolant fluid. The geometric configuration of the target heat transfer layer fins 230 and resulting target heat transfer layer microchannels 220 positioned therebetween may also be determined by computer simulation. The geometric configuration utilized for the target heat transfer layer microchannels 220 may depend on parameters such as flow resistance, the type of coolant fluid, and the desired maximum operating temperature of the power electronics device, for example.

Figure 8B:
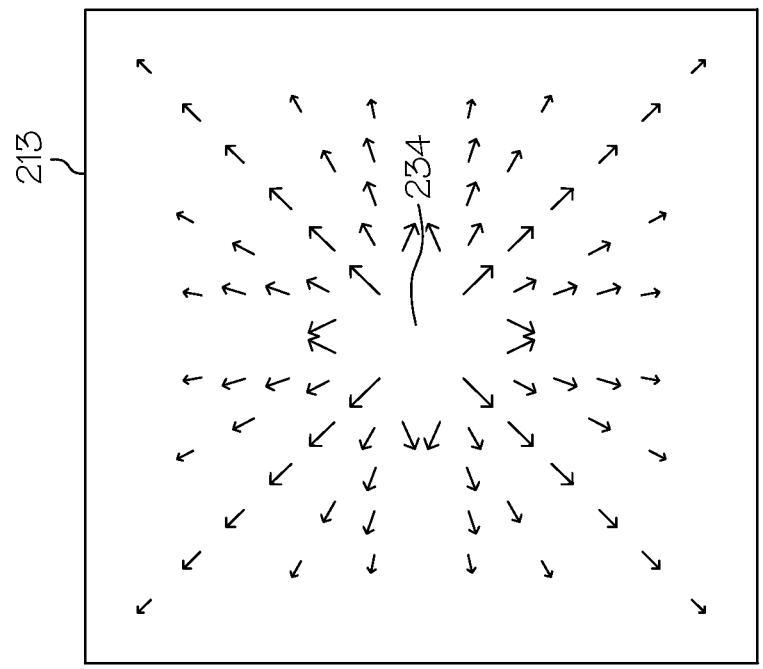
FIG. 8B schematically depicts a coolant fluid flow pattern of a target heat transfer cell of the target heat transfer layer depicted in FIG. 8A.

The impingement region 234a-234f is the central portion of the target heat transfer cell 213a-213f that the jet of coolant fluid strikes. After striking the impingement region 234, the coolant fluid flows outwardly through the target heat transfer layer microchannels 220 toward the target heat transfer cell walls 218. The target heat transfer cell walls 218 maintain the coolant fluid within the target layer cell. Referring to FIG. 8B, a coolant fluid flow pattern of a target heat transfer cell is illustrated. The coolant fluid flows from the impingement region 234 to the perimeter of the target heat transfer cell 213.

The target heat transfer layer 212 may also be made of a thermally conductive material that allows for the transfer of thermal energy from the target heat transfer layer 212 to the coolant fluid. The thermally conductive material may be those described above. The target heat transfer layer 212 and corresponding components may also be formed by a molding process, a machining process, stamping process, or similar processes to achieve the desired shape and configuration.

It is noted that the pattern defined by the target heat transfer layer microchannels 220 is different from the pattern defined by the second-pass heat transfer layer microchannels 224. The different patterns result from the difference in direction of fluid flow within the two layers. It is also noted that the second-pass heat transfer layer fins 232 differ in size and geometric configuration than those of the target heat transfer layer fins 230. It should be understood that target layer microchannel patterns and heat transfer layer microchannel patterns other than those illustrated in FIG. 5A may be utilized.

Figure 9:
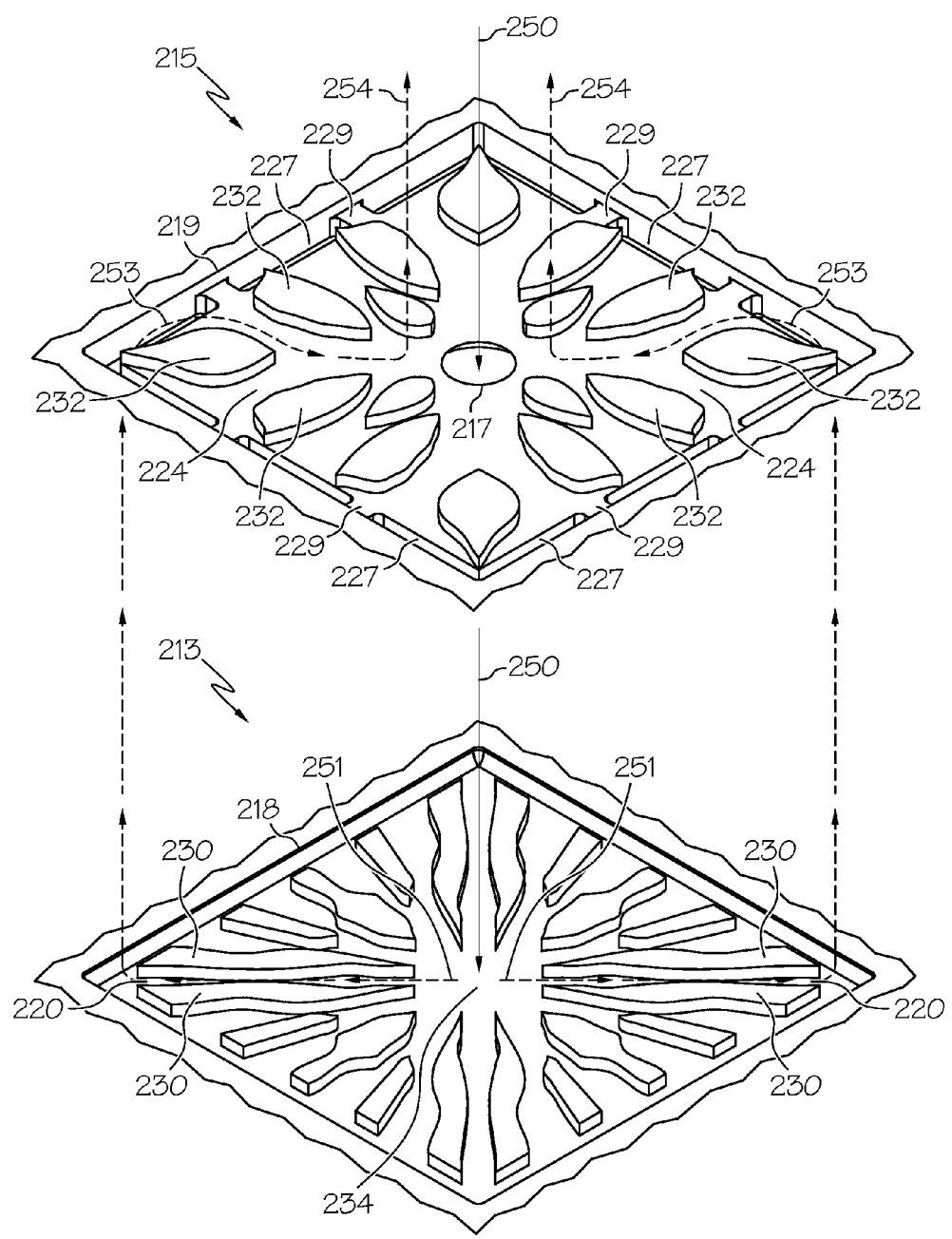
FIG. 9 schematically depicts a partial exploded perspective view of a second-pass heat transfer layer and a target heat transfer layer according to one or more embodiments shown and described herein.

Operation of an exemplary cold plate assembly 200 will now be described with general reference to FIGS. 2, 3A and 9. Heat flux generated by a power electronics device 154 coupled to a surface of the target heat transfer layer 212 exposed within the power electronics assembly cavity 120 is transferred to the cold plate assembly 200 through the target heat transfer layer 212, and the second-pass heat transfer layer 214, as well as the inlet manifold layer 260 and the outlet manifold layer 270. Coolant fluid may be introduced into the cold plate assembly 200 through the fluid inlet reservoir 113 of the frame 111 and the coolant fluid inlet 205 at the sealing layer 202. The coolant fluid then enters the inlet channel 262 via the coolant fluid inlet 205 and optimally flows toward each of the fluid inlet holes 264 at a substantially uniform flow rate. The coolant fluid flows through the impingement jet nozzles 261 where it passes through the fluid outlet holes 274 of the outlet manifold layer 270 and the central fluid outlet region 217 of the second-pass heat transfer layer 214 and impinges the impingement region 234a-234f of the target heat transfer cells 213a-213f within the target heat transfer layer 212. Referring specifically to FIG. 9, the jet of coolant fluid (illustrated by arrow 250) impinges a target heat transfer cell 213 at impingement region 234. Heat flux is transferred from the power electronics device to the coolant fluid at the impingement region 234. Preferably, the impingement region 234 is centered on a local hot spot of the power electronics device 154 such that this area of the power electronics device receives the impingement of coolant fluid.

The coolant fluid then changes direction to a flow direction that is normal to the jet of coolant fluid 250. The coolant fluid flows radially toward the perimeter of the target heat transfer cell 213 through the radially-extending target heat transfer layer microchannels 220, as indicated by arrows 251. Therefore, the coolant fluid flows over the surface of the target heat transfer layer 212 and is in contact with the various target heat transfer layer fins 230 of each target heat transfer cell to convectively and conductively transfer heat flux from the target heat transfer layer 212 to the coolant fluid. It should be understood that coolant fluid may flow through all of the target heat transfer layer microchannels 220 (and second-pass heat transfer layer microchannels 224) and that the arrows provided in FIG. 9 are for illustrative purposes only.

The coolant fluid then reaches the walls 218 of each target heat transfer cell 213 where it is then forced into the transition channels 227 of the second-pass heat transfer cells 215. The coolant fluid changes direction and flows within the transition channels 227 such that it travels in a direction that is normal to the direction of coolant flow within the target heat transfer cells 213. Enhanced thermal mixing occurs within the transition channel, which further increases heat transfer by convection.

After flowing into and out of the transition channels 227, the coolant fluid then is forced into the second-pass heat transfer cells 215a-215f where it flows in a direction that is 180 degrees from the flow direction in the target heat transfer cells. The coolant fluid flows from the perimeter toward the central fluid outlet region 217a-217f of each second-pass heat transfer cell 215a-215f as indicated by arrows 253. The coolant fluid therefore makes a second pass over the second-pass heat transfer layer 214 through the second-pass heat transfer layer microchannels 224, and continues to receive heat flux from the power electronics device. After flowing through the second-pass heat transfer layer microchannels 224, the coolant fluid exits the second-pass heat transfer cells as indicated by arrows 254. The coolant fluid concentrically flows through the fluid outlet holes 274 with respect to the impingement jet nozzles 261 positioned within each fluid outlet hole 274. The coolant fluid then flows from each fluid outlet hole 274 toward the first end 273 of the outlet channel 272, where it is forced into the coolant fluid outlet 266 and the sealing layer fluid outlet 206. The warmed coolant fluid exits the cold plate assembly 200 and flows into the fluid outlet reservoir. The warmed coolant fluid may be cooled in a secondary recirculation loop, such as an automotive radiator, for example.

In an alternative embodiment, referring to FIG. 3A, the cold plate assembly 200 disposed in the frame 111 may be configured as a single-pass jet impingement heat exchanger by not including the second-pass heat transfer layer 214 in the cold plate assembly structure. In this embodiment, the coolant fluid would impinge the target heat transfer layer 212 and then flow directly into the fluid outlet manifold layer. In another embodiment, the cold plate assembly may not be configured as a jet impingement heat exchanger but rather as a channel-based only structure wherein fluid entering the cold plate assembly would flow around heat exchanger fins of one or more heat transfer layers.

Figure 10:
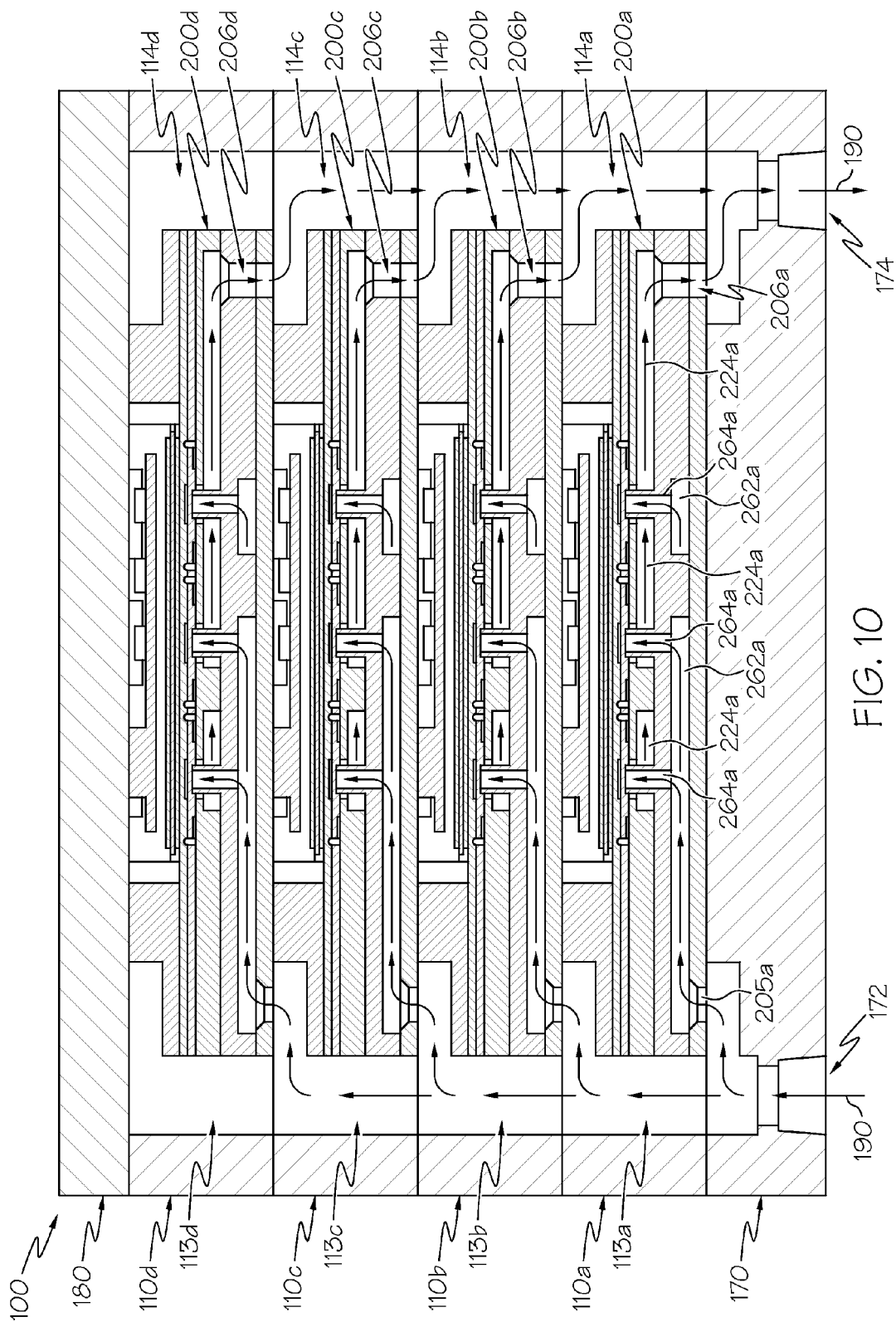
FIG. 10 schematically depicts a cross-sectional view of the power electronics module assembly according to one or more embodiments shown and described herein.

Referring now to FIG. 10, coolant fluid flow within a fully-assembled power electronics module assembly 100 will now be described. The power electronics module assembly 100 is illustrated in cross-section and comprises four stacked, individual power electronics modules 110a-110d, a first cap layer 180, and a second cap layer 170. The fluid inlet reservoir 113a and the fluid outlet reservoir 114a of a first power electronics module 110a are fluidly coupled to the fluid inlet reservoir 113b and the fluid outlet reservoir 114b of a second power electronics module 110b, respectively. The fluid inlet reservoir 113a and the fluid outlet reservoir 114b are also fluidly coupled to the fluid inlet structure 172 and the fluid outlet structure 174 of the second cap layer 170, respectively.

The fluid inlet reservoir 113b and the fluid outlet reservoir 114b of the second power electronics module 110b are fluidly coupled to the fluid inlet reservoir 113c and the fluid outlet reservoir 114c of a third power electronics module 110c, respectively. Similarly, the fluid inlet reservoir 113c and the fluid outlet reservoir 114c of the third power electronics module 110c are fluidly coupled to the fluid inlet reservoir 113d and the fluid outlet reservoir 114d of a fourth power electronics module 110d, respectively. The fluid inlet reservoir 113d and the fluid outlet reservoir 114d are sealed by the first cap layer 180.

Coolant fluid may be introduced into the power electronics module assembly 100 at the fluid inlet structure 172 of the second cap layer 170. The coolant fluid flow is indicated by arrows 190. The fluid inlet structure 172 may have a geometric shape that conforms to a fitting that may be used to couple a coolant fluid line (not shown) to the power electronics module assembly 100. The fluid inlet structure 172 is fluidly coupled to both a fluid inlet reservoir 113a and a fluid inlet 205a of a cold plate assembly 200 of a first power electronics module 110a.

Some of the coolant fluid will flow straight into the fluid inlet reservoir 113a while some of the coolant fluid will turn and flow into the fluid inlet 205a of the cold plate assembly 200. The coolant fluid entering the fluid inlet 205a flows through the inlet channel 262a, impinges the target heat transfer layer from the fluid inlet holes 264a, passes over the second-pass heat transfer layer, flows through the outlet channel 224a and exits into the fluid outlet structure 174 of the second cap layer 170 via the coolant fluid outlet 206a of the cold plate assembly 200, as described above.

The coolant fluid that flows straight into the fluid inlet reservoir 113a of the first power electronics module 110a flows into either the cold plate assembly 200b of the second power electronics module 110b or into the fluid inlet reservoir 113b of the second power electronics module 110b and so on until of the fluid passes through the cold plate assemblies 200a-200d. Warmed coolant fluid exits the cold plate assemblies 200a-200d and enters respective fluid outlet reservoirs 114a-114d where it then flows out of the fluid outlet structure 174 of the second cap layer 170.

It should now be understood that the embodiments of the described herein enable a power electronics assembly comprising stackable power electronics modules to be adjusted by adding or removing power electronics modules from the assembly depending on the particular application. Integral fluid inlet and outlet reservoirs enable any number of power electronics modules to be fluidly coupled together. Additionally, power electronics assembly recesses provide for easy access to a heat transfer surface of a cold plate assembly to thermally couple any number of power electronics devices and control circuitry. Each power electronics module comprises a compact structure having an integral cooling system, power electronics devices, and control circuit all in one flexible package.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics module comprising:
   a frame comprising:
      a first surface;
      a second surface opposite from the first surface;
      a power electronics cavity within the first surface of the frame;
      a fluid inlet reservoir; and
      a fluid outlet reservoir, wherein the fluid inlet reservoir and the fluid outlet reservoir extend between the first surface of the frame and the second surface of the frame, and the fluid inlet reservoir and the fluid outlet reservoir are configured to be fluidly coupled to one or more additional modular power electronics devices;
   a jet impingement cooler assembly sealed within the frame and fluidly coupled to the fluid inlet reservoir and the fluid outlet reservoir; and
   a power electronics assembly comprising at least one power electronics component, wherein the power electronics assembly is positioned within the power electronics cavity and is thermally coupled to the jet impingement cooler assembly.

2. The power electronics module of claim 1 wherein the jet impingement cooler assembly comprises a jet impingement multi-pass cold plate assembly comprising:

an inlet manifold layer having a coolant fluid inlet fluidly coupled to the fluid inlet reservoir;

an outlet manifold layer fluidly coupled to the fluid outlet reservoir;

a target heat transfer layer; and a second-pass heat transfer layer.

3. The power electronics module of claim 2 wherein coolant fluid flowing from the fluid inlet reservoir flows into the coolant fluid inlet of the jet impingement multi-pass cold plate assembly, impinges the target heat transfer layer, flows over the second-pass heat transfer layer, exits a fluid outlet of the jet impingement multi-pass cold plate assembly, and flows into the fluid outlet reservoir.

4. The power electronics module of claim 2 wherein:

the inlet manifold layer comprises a coolant fluid outlet and an inlet channel, the inlet channel comprising a plurality of fluid inlet holes fluidly coupled to a plurality of impingement jet nozzles, wherein at least two fluid inlet holes of the plurality of fluid inlet holes are separated from the coolant fluid inlet by an unequal distance, and an inlet coolant fluid flow rate of a coolant fluid at each fluid inlet hole is substantially uniform;

the target heat transfer layer comprises a plurality of target heat transfer cells, each target heat transfer cell comprising a plurality of target heat transfer layer fins that define a plurality of target heat transfer layer microchannels extending in a radial direction from a central impingement region;

the second-pass heat transfer layer comprises a plurality of second-pass heat transfer cells, each second-pass heat transfer cell comprising a plurality of second-pass heat transfer layer fins that define a plurality of second-pass heat transfer layer microchannels radially extending toward a central fluid outlet region, and one or more transition channels positioned at a perimeter of each second-pass heat transfer cell;

the outlet manifold layer comprises an outlet channel, the outlet channel comprising a plurality of fluid outlet holes; and the jet impingement multi-pass cold plate assembly further comprises a sealing layer thermally coupled to the inlet manifold layer, wherein the sealing layer comprises the coolant fluid inlet and a sealing layer coolant fluid outlet that is fluidly coupled to the coolant fluid outlet of the inlet manifold layer.

5. The power electronics module of claim 4 wherein:

the second-pass heat transfer layer is thermally coupled to the target heat transfer layer;

the transition channels fluidly couple the second-pass heat transfer layer to the target heat transfer layer;

the plurality of impingement jet nozzles is positioned to direct fluid through the central fluid outlet region of the second-pass heat transfer cells;

the outlet manifold layer is thermally coupled to the second-pass heat transfer layer and the inlet manifold layer;

the outlet channel is fluidly coupled to the coolant fluid outlet; and the plurality of impingement jet nozzles passes through the plurality of fluid outlet holes.

6. The power electronics module of claim 1 wherein:

the first surface comprises a first fluid inlet reservoir opening fluidly coupled to the fluid inlet reservoir and a first fluid outlet opening reservoir opening fluidly coupled to the fluid outlet reservoir; and the second surface comprises a second fluid inlet reservoir opening fluidly coupled to the fluid inlet reservoir and a second fluid outlet reservoir opening fluidly coupled to the fluid outlet reservoir.

7. The power electronics module of claim 6 further comprising a first cap layer coupled to the first surface and a second cap layer coupled to the second surface, wherein the second cap layer comprises a fluid inlet structure fluidly coupled to the second fluid inlet reservoir opening and a fluid outlet structure fluidly coupled to the second fluid outlet reservoir opening.

8. The power electronics module of claim 1 wherein the frame is a thermally conductive frame molded over the jet impingement cooler assembly.

9. The power electronics module of claim 1 wherein the power electronics assembly further comprises a power electronics drive circuit operable to control the at least one power electronics component.

10. The power electronics module of claim 1 further comprising a bus bar recess and a bus bar positioned in the bus bar recess and electrically coupled to the at least one power electronics component.

11. A power electronics module comprising:

a frame comprising:

a first surface;

a second surface opposite from the first surface;

a power electronics cavity within the first surface of the frame, wherein the power electronics cavity is configured to maintain a power electronics assembly;

a fluid inlet reservoir; and a fluid outlet reservoir, wherein the fluid inlet reservoir and the fluid outlet reservoir extend between the first surface of the frame and the second surface of the frame, and the fluid inlet reservoir and the fluid outlet reservoir are configured to be fluidly coupled to one or more additional modular power electronics devices; and a multi-pass cold plate assembly sealed within the frame and fluidly coupled to the fluid inlet reservoir and the fluid outlet reservoir, the multi-pass cold plate assembly comprising:

an inlet manifold layer fluidly coupled to the fluid inlet reservoir;

an outlet manifold layer fluidly coupled to the fluid outlet reservoir;

a target heat transfer layer; and a second-pass heat transfer layer.

12. The power electronics module of claim 11 wherein:

the first surface comprises a first fluid inlet reservoir opening fluidly coupled to the fluid inlet reservoir and a first fluid outlet opening reservoir opening fluidly coupled to the fluid outlet reservoir; and the second surface comprises a second fluid inlet reservoir opening fluidly coupled to the fluid inlet reservoir and a second fluid outlet reservoir opening fluidly coupled to the fluid outlet reservoir.

13. The power electronics module of claim 12 further comprising a first cap layer coupled to the first surface and a second cap layer coupled to the second surface, wherein the second cap layer comprises a fluid inlet structure fluidly coupled to the second fluid inlet reservoir opening and a fluid outlet structure fluidly coupled to the second fluid outlet reservoir opening.

14. The power electronics module of claim 11 wherein the frame is a thermally conductive frame molded over the multi-pass cold plate assembly.

15. The power electronics module of claim 11 further comprising a bus bar recess and a bus bar positioned in the bus bar recess.

16. A power electronics module assembly comprising:
a first power electronics module fluidly coupled to a second power electronics module, the first power electronics module and the second power electronics module each comprising:
   a frame comprising:
      a first surface;
      a second surface opposite from the first surface;
      a power electronics cavity within the first surface of the frame;
      a fluid inlet reservoir; and
      a fluid outlet reservoir, wherein the fluid inlet reservoir and the fluid outlet reservoir extend between the first surface of the frame and the second surface of the frame; and
   a multi-pass cold plate assembly sealed within the frame and fluidly coupled to the fluid inlet reservoir and the fluid outlet reservoir; and
   a power electronics assembly comprising at least one power electronics component, wherein the power electronics assembly is positioned within the power electronics cavity and is thermally coupled to the multi-pass cold plate assembly; and
a first cap layer coupled to the first surface of the first power electronics module; and
a second cap layer coupled to the second surface of the second power electronics module, wherein:
   the second cap layer comprises a fluid inlet structure fluidly coupled to the fluid inlet reservoir and a fluid outlet structure fluidly coupled to the fluid outlet reservoir;
   the fluid inlet reservoir of the first power electronics module is fluidly coupled to the fluid inlet reservoir of the second power electronics module; and
   the fluid outlet reservoir of the first power electronics module is fluidly coupled to the fluid outlet reservoir of the second power electronics module.

17. The power electronics module assembly of claim 16 wherein the multi-pass cold plate assembly comprises:
an inlet manifold layer fluidly coupled to the fluid inlet reservoir;
an outlet manifold layer fluidly coupled to the fluid outlet reservoir;
a target heat transfer layer; and
a second-pass heat transfer layer.

18. The power electronics module assembly of claim 16 wherein:
the first surface of the first power electronics module and the first surface of the second power electronics module comprise a first fluid inlet reservoir opening fluidly coupled to the fluid inlet reservoir and a first fluid outlet reservoir opening fluidly coupled to the fluid outlet reservoir;
the second surface of the first power electronics module and the second surface of the second power electronics module comprise a second fluid inlet reservoir opening fluidly coupled to the fluid inlet reservoir and a second fluid outlet reservoir opening fluidly coupled to the fluid outlet reservoir; and
the first fluid inlet reservoir opening and the first fluid outlet reservoir opening of the first power electronics module is fluidly coupled to the second fluid inlet reservoir opening and the second fluid outlet reservoir opening, respectively.

19. The power electronics module assembly of claim 16 further comprising one or more additional power electronics modules positioned between the first power electronics module and the second power electronics module, wherein the first power electronics module, the one or more additional power electronics modules, and the second power electronics module are fluidly coupled together by respective fluid inlet reservoirs and fluid outlet reservoirs.

20. The power electronics module assembly of claim 16 wherein:
the first power electronics module, the second power electronics module, the first cap layer, and the second cap layer each comprise a plurality of through-hole features and a plurality of fasteners; and
the plurality of fasteners are disposed within the plurality of through-hole features to mechanically couple the first power electronics module, the second power electronics module, the first cap layer, and the second cap layer.

* * * * *